US008366870B2

(12) United States Patent
Nishio et al.

(10) Patent No.: US 8,366,870 B2
(45) Date of Patent: *Feb. 5, 2013

(54) METHOD AND APPARATUS FOR PLASMA PROCESSING

(75) Inventors: Ryoji Nishio, Kudamatsu (JP);
Tadamitsu Kanekiyo, Kudamatsu (JP);
Yoshiyuki Oota, Kudamatsu (JP);
Tsuyoshi Matsumoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/103,666

(22) Filed: May 9, 2011

(65) Prior Publication Data

US 2011/0209828 A1    Sep. 1, 2011

Related U.S. Application Data

(63) Continuation of application No. 10/902,032, filed on Jul. 30, 2004.

(30) Foreign Application Priority Data

Apr. 14, 2004   (JP) ................................ 2004-118513

(51) Int. Cl.
*C23F 1/08* (2006.01)
*H01L 21/66* (2006.01)
(52) U.S. Cl. ................................. 156/345.28
(58) Field of Classification Search ............. 156/345.51, 156/345.28; 118/723 R
See application file for complete search history.

(56) References Cited

U.S. PATENT DOCUMENTS

| 5,556,500 | A | 9/1996 | Hasegawa et al. |
| 6,199,029 | B1 | 3/2001 | Ohta |
| 6,465,266 | B1 | 10/2002 | Yassine et al. |
| 6,475,336 | B1 | 11/2002 | Hubacek |

(Continued)

FOREIGN PATENT DOCUMENTS

| JP | 63-229719 | 9/1988 |
| JP | 05-335283 | 12/1993 |

(Continued)

OTHER PUBLICATIONS

Thevnin's Theorem. Wikipedia taken from http://en.wikipedia.org/wiki/Th%C3%A9evnin's_theorem, Dec. 9, 2003 (public availability date).

*Primary Examiner* — Sylvia R. MacArthur
(74) *Attorney, Agent, or Firm* — Antonelli, Terry, Stout & Kraus, LLP.

(57) ABSTRACT

The invention provides a plasma processing apparatus capable of minimizing the non-uniformity of potential distribution around wafer circumference, and providing a uniform process across the wafer surface. The apparatus is equipped with a focus ring formed of a dielectric, a conductor or a semiconductor and having RF applied thereto, the design of which is optimized for processing based on a design technique clarifying physical conditions for flattening a sheath-plasma interface above a wafer and the sheath-plasma interface above the focus ring. A surface voltage of the focus ring is determined to be not less than a minimum voltage for preventing reaction products caused by wafer processing from depositing thereon. The surface height, surface voltage, material and structure of the focus ring are optimized so that the height of an ion sheath formed on the focus ring surface is either equal or has a height difference within an appropriate tolerance range to the height of the ion sheath formed on the wafer surface. Optimization of the structure is realized by setting up an appropriate tolerance range taking into consideration the variation caused by consumption of the focus ring.

1 Claim, 21 Drawing Sheets

U.S. PATENT DOCUMENTS 6,554,954 B2 4/2003 Ma et al.
2011/0209828 A1* 9/2011 Nishio et al. ............. 156/345.28

FOREIGN PATENT DOCUMENTS

| JP | 06-120140 | 4/1994 |
| --- | --- | --- |
| JP | 06-168911 | 6/1994 |
| JP | 2002-198355 | 7/2002 |
| JP | 2002-203835 | 7/2002 |
| JP | 2003-503841 | 1/2003 |
| JP | 2003-519907 | 6/2003 |
| JP | 2003-229408 | 8/2003 |
| WO | WO 01/50497 | 7/2001 |

* cited by examiner

METHOD AND APPARATUS FOR PLASMA PROCESSING

CROSS REFERENCE TO RELATED APPLICATION

This application is a Continuation of U.S. application Ser. No. 10/902,032, filed Jul. 30, 2004, and is related to U.S. patent application Ser. No. 11/802,958, filed on May 29, 2007, now abandoned, and U.S. patent application Ser. No. 11/802,955, filed on May 29, 2007, now abandoned, and claims priority from Japanese Patent Application No. 2004-118513, filed on Apr. 14, 2004, the contents of which are incorporated herein by reference.

FIELD OF THE INVENTION

The present invention relates to the art of semiconductor fabrication. Especially, the invention relates to a structure of a wafer stage that affects the etching contour when providing an etching process to a semiconductor wafer using plasma.

DESCRIPTION OF THE RELATED ART

Recently, along with the enhancement in the integration of semiconductor elements, the circuit patterns have become more and more refined, and the demanded accuracy of processing dimension has become stricter. Further, the wafer diameter is increased to 300 mm in the attempt to reduce fabrication costs of the semiconductor elements, but processing is required to be uniform across the whole surface of the wafer from the center to the outer circumference thereof. However, a ceramic cover for protecting an electrostatic chuck is disposed near the outer circumference of the wafer, for example, which causes non-uniformity of the electric field at the circumference compared to the center of the wafer, and causes the drawback of non-uniformity of the wafer process. If electric field non-uniformity is caused near the outer circumference of the wafer, the ions being incident on the wafer will not be perpendicular to the wafer, by which the perpendicularity of the contour is deteriorated and the yield factor reduced. Similarly, focusing and divergence of the ions occur, by which the processing performance such as the etching rate varies greatly near the wafer edge. These are serious problems since they cause the increase of fabrication costs In order to solve this problem, many measures have been proposed for preventing the distortion of electric field of the electrode on which the wafer is placed. The structure for realizing this is called a focus ring or an edge ring, and in this specification it is referred to as a focus ring. For example, a dry etching device equipped with a ring type auxiliary plate having an adjustable height for surrounding the periphery of the wafer is proposed (refer for example to patent document 1). Further, a means for controlling an RF power (voltage or electric field) applied to the wafer edge and the outer periphery thereof by controlling the impedance of the wafer edge and the outer periphery thereof is proposed (refer for example to patent document 2). Similarly, structures for controlling the electric field near the wafer edge with a focus ring having RF applied thereto are proposed, wherein the focus ring is a conductive member (refer for example to patent document 3) or wherein the focus ring is a dielectric (refer for example to patent document 4). Further, there is a proposal of an elevated focus ring (edge ring) formed of a dielectric material or a semiconductor material for flattening the sheath-plasma interface above the wafer and the sheath-plasma interface above the focus ring when RF is not applied, and a focus ring (edge ring) having the same height as the wafer formed of dielectric or semiconductor material for flattening the sheath-plasma interface above the wafer and the sheath-plasma interface above the focus ring when RF is applied thereto (refer for example to patent document 5). Moreover, there is a proposal of a focus ring formed by assembling a dielectric and a conductor for generating a uniform sheath voltage by making the impedance between the lower electrode and plasma equal at both the wafer and the focus ring (refer for example to patent document 6).

Moreover, a method for achieving a uniform process is proposed, that adjusts the intensity of RF passing the focus ring by adjusting the impedance thereof (refer for example to patent document 7). Moreover, another method for achieving a uniform process through use of a focus ring having the same height as the wafer surface is proposed (refer for example to patent document 8).

Patent Document 1:
   Japanese Patent Application Laid-Open No. 63-229719
Patent Document 2:
   Japanese Patent Application Laid-Open No. 6-120140
Patent Document 3:
   Japanese Patent Application Laid-Open No. 5-335283
Patent Document 4:
   Japanese Patent Application Laid-Open No. 6-168911
Patent Document 5:
   International Publication under PCT No. WO 01/01445 A1 (Published in Japan as P2003-503841)
Patent Document 6:
   International Publication under PCT No. WO 01/50497 A1 (Published in Japan as P2003-519907)
Patent Document 7:
   Japanese Patent Application Laid-Open No. 2002-198355
Patent Document 8:
   Japanese Patent Application Laid-Open No. 2003-229408
Patent Document 9:
   Japanese Patent Application Laid-Open No. 2002-203835

According to the above-mentioned prior art methods, however, there is no disclosure of a technique for optimizing the focus ring structure. Even if the focus ring structure is determined through experiments, the design of the focus ring must be reconsidered each time the etching process is changed. In a general fabrication process, a single apparatus is not only used to carry out a single discharge process, but used to carry out multiple discharge conditions. Therefore, the focus ring must be exchanged depending on discharge conditions. In an alternative technique, a single focus ring structure can be designed to correspond to various discharge conditions by setting up a tolerance and optimizing the structure corresponding to the set tolerance. However, the prior art lacks to disclose such technique.

Furthermore, since the focus ring is subjected to the application of RF voltage while being exposed to reactive plasma, the ring is consumed both physically by ions (through sputtering etc.) and chemically by reaction, by which the dimension of the ring is changed. Therefore, the electric field correcting function of the focus ring changes with time and deteriorated. Therefore, it is necessary to set up a tolerance and to optimize the structure accordingly, but the prior art lacks to disclose such technique.

On the other hand, reaction products generated through wafer processing and reaction products in the gas may be deposited on the surface of the focus ring, depending on the property of the wafer processing. The deposits on the focus ring surface may become particles that adhere to the wafer and cause defective products to be fabricated. Further, during the course of the procedure starting from the state in which there are no deposits to the state in which sufficient deposition is formed, the gas-phase components released from the focus ring surface are varied, according to which the plasma status is changed. This may cause time variation of the wafer process according to which the result of wafer processing is changed with time from the starting of wafer processing. The conventional methods lack to provide a method for coping with the deposition, so the focus ring may be helpful to uniformize the processing, but it is not actually useful if deposition occurs.

As disclosed in patent document 5 mentioned above, in order to uniformize the process at the wafer edge portion, it is important that the plasma-sheath interface above the wafer and the plasma-sheath interface above the focus ring are flat. However, the ion trajectory toward the wafer does not depend only on the plasma-sheath interface, but also on the flatness of the potential field within the sheath. The latter important factor has not been considered in the conventional attempt to optimize the structure. Of course, patent document 5 lacks to disclose any teachings related to determining the tolerance and optimizing the structure based thereon. The drawback of the conventional optimization process disclosed in document 5 is that there is no teaching of a physical method or design technique for flattening the plasma-sheath interface above the wafer and the plasma-sheath interface above the focus ring. The optimization of the structure is impossible to carry out without a physical mechanism or a design technique. Even when an appropriate structure is discovered through experimental methods, it is difficult to prove experimentally that the plasma-sheath interface above the wafer and the plasma-sheath interface above the focus ring are flat, and the flatness cannot be ensured.

The drawback of the technique disclosed in patent document 6 mentioned above is that the generation of a uniform sheath voltage realized by equalizing the impedance between the lower electrode and plasma at the wafer portion and at the focus ring portion does not guarantee the flattening of the plasma-sheath interface above the wafer and the plasma-sheath interface above the focus ring. An additional condition must be fulfilled to ensure that the plasma-sheath interface above the wafer and the plasma-sheath interface above the focus ring are flat, but patent document 6 lacks to teach such condition.

A more detailed description of these drawbacks will appear in the description of the preferred embodiment of the present invention.

Considering the above drawbacks of the prior art, the first object of the present invention is to provide a wafer processing method and an etching apparatus comprising a wafer stage capable of providing uniform processing across the whole wafer plane, while minimizing the non-uniformity of the potential distribution around the wafer circumference.

The second object of the present invention is to provide a wafer processing method and an etching apparatus comprising a wafer stage, wherein a tolerance of the wafer stage has been set up and the structure of the wafer stage is optimized to correspond to the set tolerance, in order to provide uniform processing across the wafer plane.

SUMMARY OF THE INVENTION

The first object of the present invention is achieved by providing a focus ring made of a dielectric, a conductor or a semiconductor, and having RF applied thereto. However, at this time, the surface voltage of the focus ring must be not less than a minimum voltage for preventing reaction products generated by the wafer processing from depositing thereon.

The present invention is also characterized in that the surface height, the surface voltage, the material and the structure of the focus ring are optimized so that the height of the ion sheath formed on the focus ring surface is either equal or has a height difference within an appropriate tolerance range to the height of the ion sheath formed on the wafer surface. Furthermore, the present invention characterizes in that the optimization of structure is performed based on a tolerance set appropriately by taking into consideration the variation by time of the focus ring caused by consumption.

The first and second objects of the present invention are achieved by clarifying the physical conditions for flattening the plasma-sheath interface above the wafer and the plasma-sheath interface above the focus ring, and by establishing a design technique for designing the actual structure thereof.

More specifically, the present invention provides a plasma processing apparatus for processing an object to be processed using plasma and a method for plasma processing using this apparatus, the apparatus comprising a process stage for placing the object to be processed; and a focus ring disposed on the process stage surrounding the object to be processed, the focus ring and the object to be processed being subjected to application of RF bias; wherein a structure of the focus ring and the process stage is optimized through an optimization design technique by equivalent circuit analysis.

According to the plasma processing apparatus or plasma processing method mentioned above, the optimization design technique includes an equivalent circuit modeling of plasma and ion sheath based on a plasma-sheath model; or the optimization design technique optimizes a focus ring surface potential so as to prevent wafer process reaction products from adhering to the focus ring; or the optimization design technique optimizes a focus ring surface height, a focus ring surface voltage, a focus ring material and a focus ring structure so that a height of an ion sheath formed on the focus ring surface is either equal or has a height difference within an appropriate tolerance range to a height of an ion sheath formed on the wafer surface; or the optimization design technique optimizes the structure by setting up an appropriate tolerance taking into consideration a variation by time caused by consumption of the focus ring; or the optimization design technique aims at flattening as much as possible an equipotential surface within an ion sheath through the equivalent circuit analysis and, when necessary, a sequential coupling analysis based on two dimensional plasma analysis and two dimensional electric field analysis.

Furthermore, according to the plasma processing apparatus and plasma processing method mentioned above, the optimization design technique comprises two plasma-sheath interface flattening conditions, one of which is that a voltage drop of an RF voltage from an electrode in the process stage to the plasma-sheath interface above the object to be processed must be equal to the voltage drop of the RF voltage from the electrode in the processing stage to the plasma-sheath interface above the focus ring; and the other plasma-sheath interface flattening condition is that a sum of a surface height of the object to be processed measured from a certain height reference point and a sheath thickness above the object to be processed must be equal to a sum of a surface height of the focus ring measured from the height reference point and the sheath thickness above the focus ring.

Further, the present invention provides a focus ring of a plasma processing apparatus for processing an object to be processed using plasma, the apparatus comprising a process stage for placing the object to be processed, and the focus ring disposed on the process stage surrounding the object to be processed, the focus ring and the object to be processed being subjected to application of RF bias; wherein the material of the focus ring has a relative dielectric constant of 10 or less.

Moreover, the present invention provides a focus ring of a plasma processing apparatus for processing an object to be processed using plasma, the apparatus comprising a process stage for placing the object to be processed, and the focus ring disposed on the process stage surrounding the object to be processed, the focus ring and the object to be processed being subjected to application of RF bias; wherein the focus ring comprises a first focus ring formed of a dielectric material having a relative dielectric constant of 10 or less, and a second focus ring formed to surround the first focus ring.

As mentioned, according to the present invention, the focus ring structure can be optimized to correspond to the object of wafer processing through use of an equivalent circuit analysis, a two dimensional plasma analysis, a two dimensional electric field analysis and plasma-sheath interface flattening conditions, and through use of the optimized structure, can maximize the uniformity of the process rate and processed structure shape across the whole wafer surface.

Furthermore, the present invention enables to prevent deposition of process reaction products on the focus ring surface, by which the life of the focus ring can be extended significantly.

DETAILED DESCRIPTION OF THE PREFERRED EMBODIMENT

Figure 1:
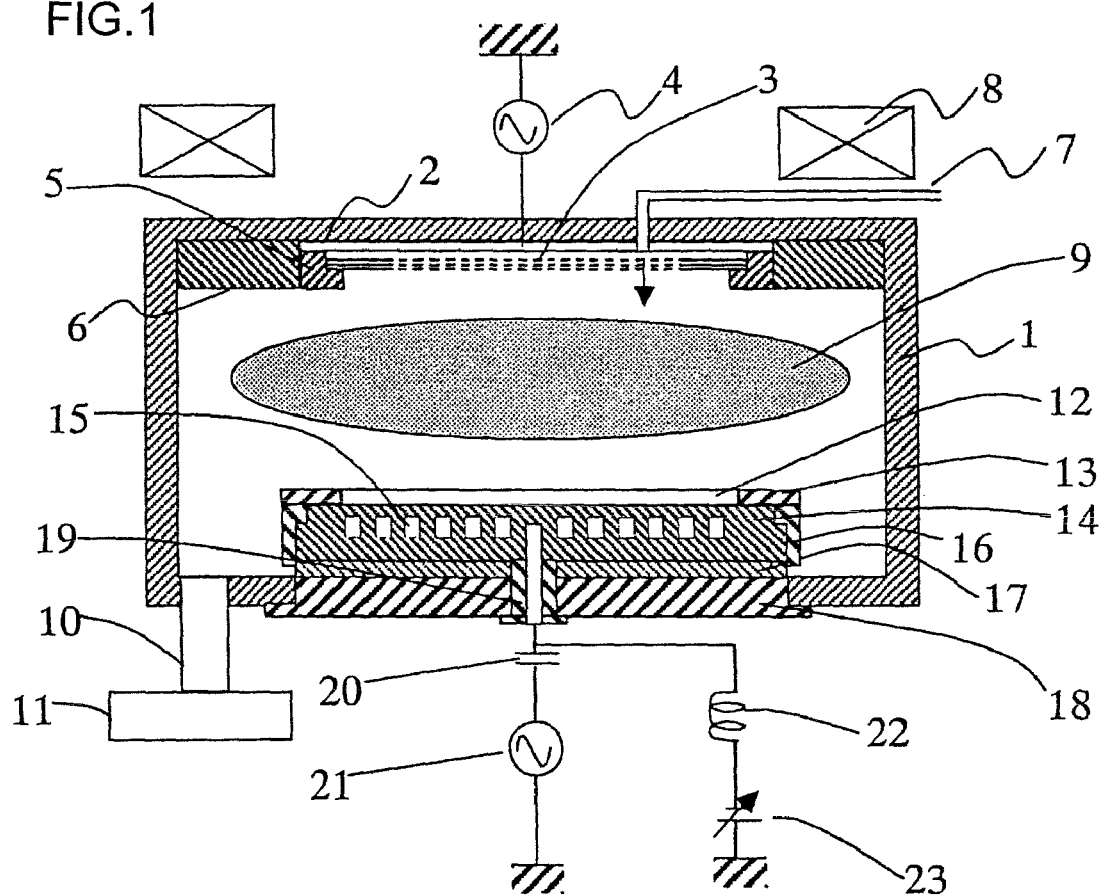
FIG. 1 is a schematic cross-sectional view showing the overall structure of a plasma processing apparatus according to the present invention.

The overall structure of a plasma processing apparatus according to the present invention will now be described with reference to the schematic cross-sectional view of FIG. 1. The plasma processing apparatus comprises a processing chamber 1 formed of conductive material such as aluminum, and an antenna 2 and a shower plate 3 are attached to the interior of the chamber via respective support flanges 5 and 6. Gas is supplied between the antenna 2 and the shower plate 3 via a process gas inlet pipe 7 from the atmosphere, and showered into the processing chamber 1 through multiple micropores formed to the shower plate 3. The antenna 2 is formed of a conductor, but the shower plate 3 can be formed of a conductor, a dielectric or a semiconductor. If the shower plate 3 is formed of conductive material or semiconductor, the shower plate 3 acts as an antenna for transmitting electric power directly to plasma. The process gas is evacuated via an evacuation duct 10 into an evacuator 11, so that the chamber is maintained at a pressure suitable for processing. By supplying through a first RF power supply 4 a radio frequency of a predetermined frequency and power, plasma 9 is generated with parameters preferable for processing. A magnet (electromagnet) 8 can be used to control the plasma parameters, but can be omitted. The configuration mentioned here relates to a discharge method so-called a capacitive coupled discharge, but according to the present invention, other types of discharge methods such as electron cyclotron resonance discharge and inductive coupled discharge can also be adopted as long as plasma having appropriate properties for processing is generated. Of course, the configuration of the discharge unit should correspond to the discharge method being adopted, and should not be restricted to the one described here.

A wafer (substrate to be processed) 12 is carried into the processing chamber 1 through a gate (not shown) from the atmosphere, and placed on an electrode 14 by an appropriate transfer device (not shown). The upper face of the electrode 14 is provided with an electrostatic chucking film (not shown) with appropriate property to chuck the wafer by the voltage applied thereto via a chalk coil 22 from a DC power supply 23 disposed outside. The electrode 14 further has a refrigerant channel 15 formed to the interior thereof, to which refrigerant is supplied from the outside (not shown), so as to control the temperature of the wafer 12 to a temperature appropriate for processing. A focus ring 13 is disposed to the outer circumference area of the wafer 12, and a susceptor 16 is disposed to protect the electrode 14 from plasma 9. The electrode 14 is attached to the processing chamber 1 via an insulating base 17 and an electrode base flange 18. The electrode 14 can be moved up and down via an appropriate elevation mechanism (not shown), when it is desirable to vary the distance between the wafer 12 and the shower plate 3. The present invention can be applied regardless of whether such elevation mechanism is adopted. An RF power is supplied from a second RF power supply 21 via a blocking capacitor 20 and a conductor protected by an insulating duct 19 to the electrode 14, according to which an RF bias is applied to the wafer 12. As mentioned, the first RF power supply 4 is not necessary configured as illustrated, and for example, the output thereof can be applied to the blocking capacitor 20 in parallel with the second RF power supply 21. It is also possible to omit the first RF power supply 4, and to have the second RF power supply 21 work both to generate plasma 9 and to apply RF bias to the wafer 12.

Figure 2:
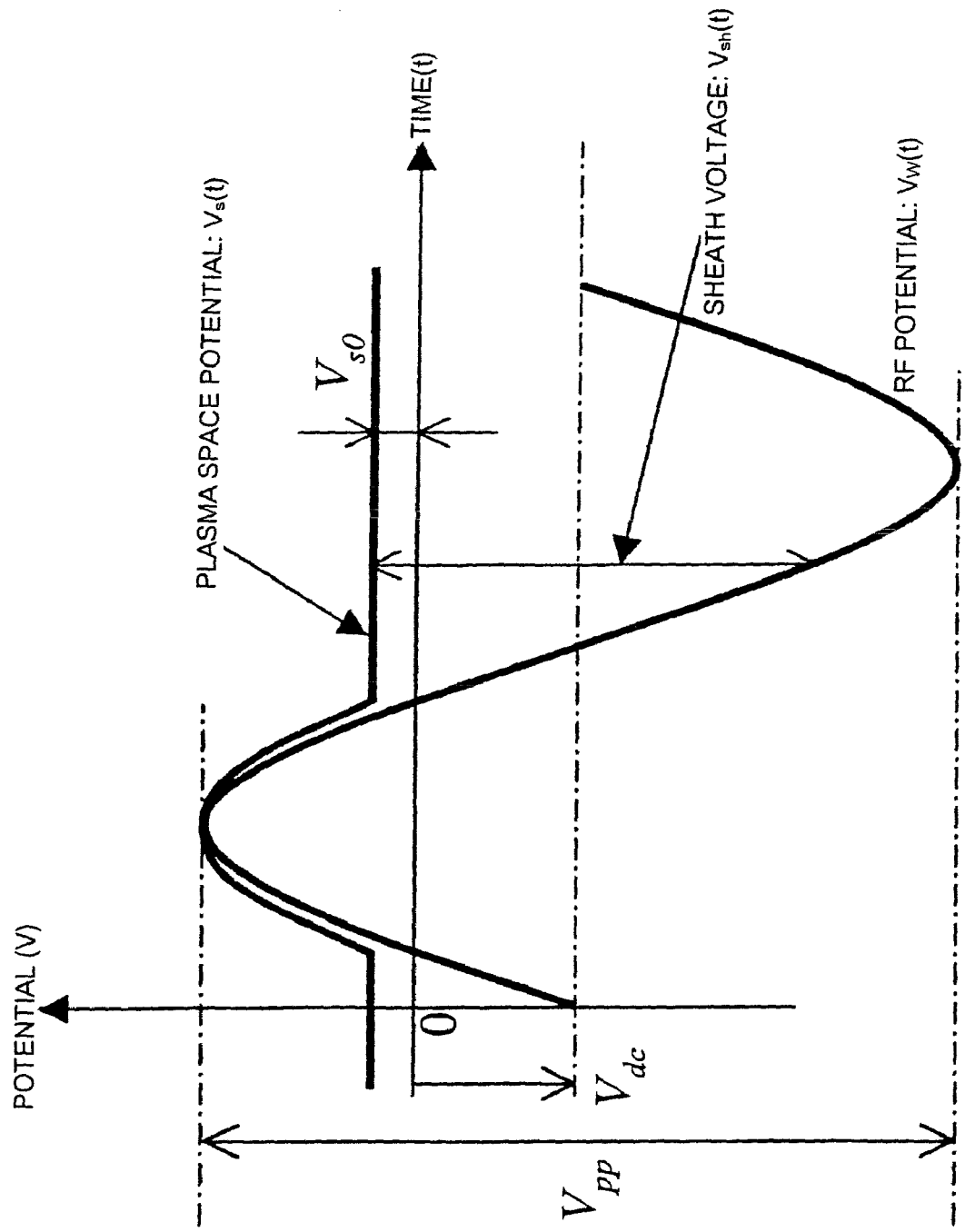
FIG. 2 is a graph showing the relationship between RF potential, plasma space potential and sheath voltage.

Next, FIGS. 2 through 8 are referred to in describing how the RF bias is applied to the wafer and focus ring, how the thickness of the ion sheath relates to this phenomenon, and how the focus ring is designed based on an equivalent circuit model corresponding to these physical phenomena. The applications of RF bias to the wafer surface and to the focus ring surface are the same phenomena, so we will only describe the application to the wafer. FIG. 2 shows the relationship between the RF potential waveform on the wafer surface ($V_w$) and the plasma space potential ($V_s$). The peak-to-peak voltage $V_{pp}$ of the RF potential waveform and the self-bias voltage $V_{dc}$ are defined in the drawing. The self-bias voltage $V_{dc}$ is a potential in which the sum of electron current and ion current flowing into the wafer from plasma is net zero for one RF cycle, and it is also the time-average value of the surface voltage of wafer. On the other hand, the plasma space potential takes a fixed value when RF voltage is sufficiently low (defined as $V_{s0}$ in FIG. 2), but when the RF potential exceeds the plasma space potential, it increases along with RF potential, and substantially equals RF potential when the RF potential takes the maximum value. The reason why the plasma space potential increases along with the RF potential is that the plasma becomes ion rich since the increasing RF potential draws out a large amount of electrons from plasma. Now, the ratio of $V_{dc}$ and $V_{pp}$ ($V_{dc}/V_{pp}$) depends on the RF frequency and the ground impedance seen from the wafer, and if the energy distribution function of electrons in the plasma corresponds to a Maxwell distribution, it is always $0 < V_{dc}/V_{pp} < 0.5$. As the RF frequency increases, and as the impedance of the ground increases, $V_{dc}/V_{pp}$ approximates 0. In other words, $V_{dc}/V_{pp}$ is a value specific to the apparatus, and the designer of the apparatus can acquire the value easily through measurement, or through analysis (simulation) of related experimental data. Once this value is acquired, the value of $V_{dc}$ can be computed easily by measuring $V_{pp}$ (or by calculating the same by circuit simulation). Here, based on FIG. 2, the voltage $V_{sh}(t)$ applied to the ion sheath formed on the wafer surface varies with time t, and can be expressed by the following formula.

[Formula 1]

$$V_{sh}(t) = V_s(t) - V_w(t) \quad (1)$$

Figure 3:
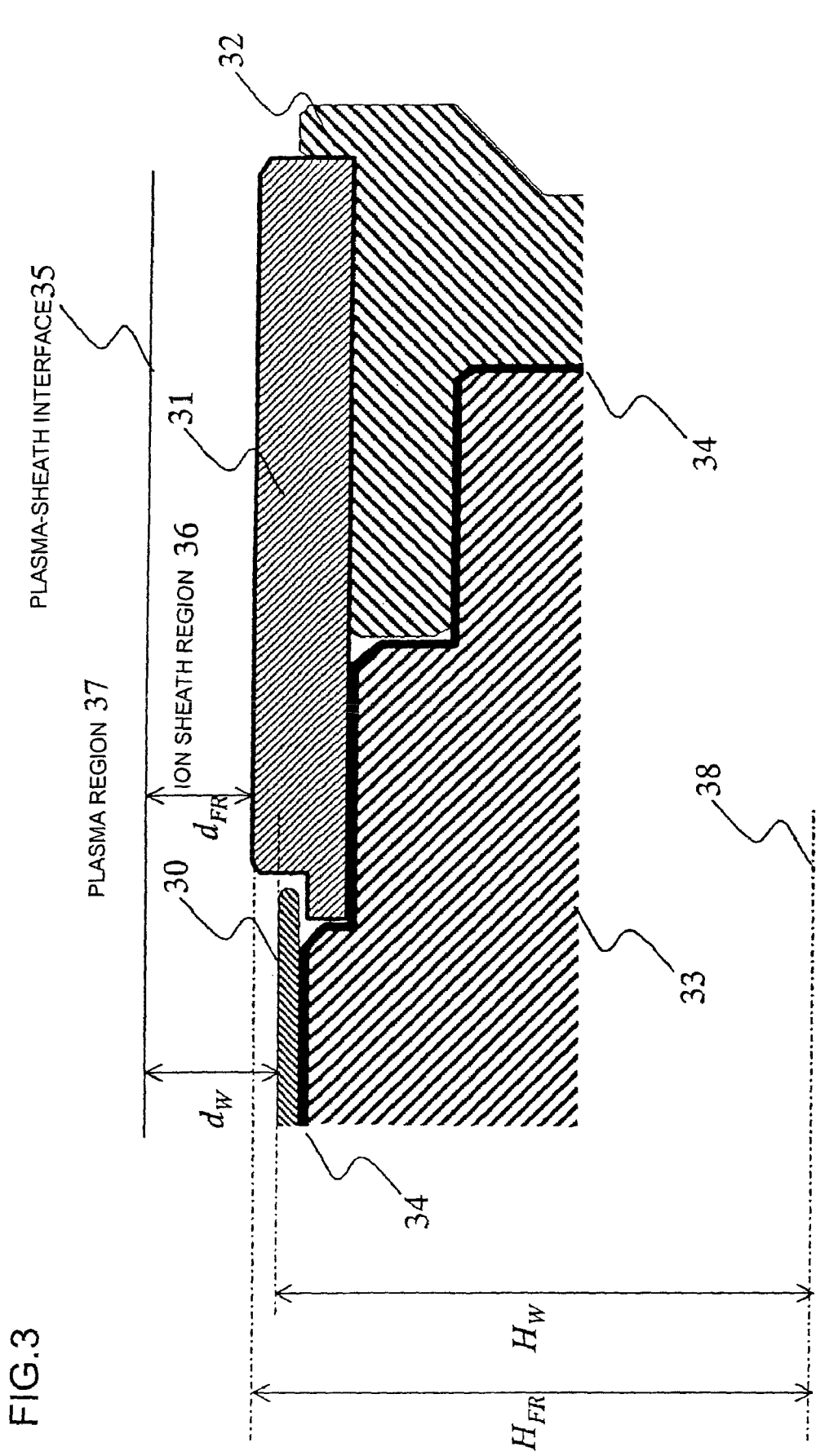
FIG. 3 is an enlarged cross-sectional view near a focus ring of a plasma processing apparatus corresponding to a first embodiment of the present invention.

Next, sheath thickness will be described. Sheath thickness can be expressed by a function of Debye length $\lambda_d$ and sheath voltage, regardless of whether the sheath is DC sheath or RF sheath. This is because Debye length is the unit length of electric field shielding by charged particles, so whether the sheath voltage can be maintained (wafer voltage can be shielded) or not is determined by forming a sheath thickness that corresponds to how many times the Debye length. Whether to treat the sheath as a matrix sheath or a Child-law sheath, or whether to consider the effect of collision, are determined by the operation status of the apparatus. Here, we will describe the case where Child-law sheath is used as an example. As can be seen from FIG. 2, since the sheath voltage varies within one RF cycle, the sheath thickness is also varied within one RF cycle. However, in order to compute the surface voltage of the focus ring or wafer using the equivalent circuit model described later, the variation in sheath thickness (as illustrated in FIG. 3, sheath thickness is an important element for determining the sheath impedance) makes handling difficult. Therefore, we will consider averaging the sheath thickness (impedance) within a single RF cycle. In this case, the average $d_{sh}$ of sheath thickness can be calculated using the following formula.

[Formula 2]

$$d_{sh} = 0.642 \frac{\lambda_d}{\tau} \int_0^\tau \left( \frac{2V_{sh}(t)}{T_e} \right)^{\frac{3}{4}} dt \quad (2)$$

wherein T represents time of a single Rf cycle, and Te represents electron temperature.

The important thing is to acquire a tool for designing the focus ring by defining the relationship between the wafer surface voltage and sheath thickness, and what type of formula is used to compute the voltage and sheath thickness is not important. The formula to be used for the present invention can be made more simplified or more complex, as long as the design accuracy can be ensured as a result.

We will now describe the method of replacing the above-mentioned theory with a specific equivalent circuit model. For simplicity, a structure illustrated in FIG. 3 showing a first embodiment of the present invention will be considered. On the surface of an electrode 33, a dielectric film 34 for electrostatic chucking is formed via thermal spray coating of alumina or the like. A wafer 30 and a focus ring 31 are mounted thereon, and a susceptor 32 for protecting the electrode 33 and dielectric film 34 is disposed. Although not shown, an RF power supply and a DC power supply for electrostatic chucking are connected to the electrode 33, by which the wafer 30 is chucked to the dielectric film 34, and the wafer 30 and focus ring 31 are subjected to RF bias.

Plasma region 37 is formed above the wafer 30 and focus ring 31, and an ion sheath region 36 is formed below a plasma-sheath interface 35. Now, the sheath thickness $d_{sh}$ given in formula 2 is the distance between the surface of wafer 30 (or focus ring 31) and plasma-sheath interface 35, and corresponds to $d_w$ or $d_{FR}$ in FIG. 3. In general, the wafer 30 can be handled as a conductor. That is, even if a dielectric film is formed on the wafer surface, the thickness thereof is very thin, so the capacitance of the wafer is greater by few digits than the capacitance of the dielectric film 34. Therefore, the impedance thereof is smaller by few digits, and it will not affect the overall circuit operation. If this precondition is not true, one should simply substitute the wafer with a more detailed equivalent circuit and determine the circuit constant thereof. The most direct method is to use a network analyzer to directly measure the impedance from the electrode 33 to the wafer 30 surface. According to this method, it is possible to obtain the impedance value for substitution to a simple equivalent circuit without having to determine a complex equivalent circuit and its circuit constant. By carrying out this measurement for a few structures, it is possible to determine the impedance through interpolation/extrapolation even when the structure is changed.

The material of the focus ring 31 can be a dielectric, an insulator, a semiconductor or a combination thereof. It is also possible to compute the equivalent circuit using the material property and shape regarding the focus ring.

Further, it is also possible to calculate the impedance of a necessary section directly using the aforementioned network analyzer. According to one example, the capacitance between the electrode 33 and the Si focus ring 31 is calculated to be 4467 pF. On the other hand, the capacitance computed from the impedance measured by the network analyzer is 4513 pF, which showed a favorable match. Regardless of the shape, structure and property of the wafer 30 and focus ring 31, the RF power applied to the electrode 33 passes through the surface of the wafer 30 and focus ring 31 and is transmitted to the sheath 36 and plasma 37, so it is realistically possible to compute the impedance thereof. If the focus ring 31 is a dielectric or a semiconductor, it is possible to measure the impedance by forming an electrode to the necessary portion (for example, by depositing aluminum or copper film). Whether or not to incorporate the susceptor 32 to the equivalent circuit should be determined based on whether the impedance between the electrode 33 and susceptor 32 surface is negligible compared to the impedance between the wafer 30 or focus ring 31.

Figure 4:
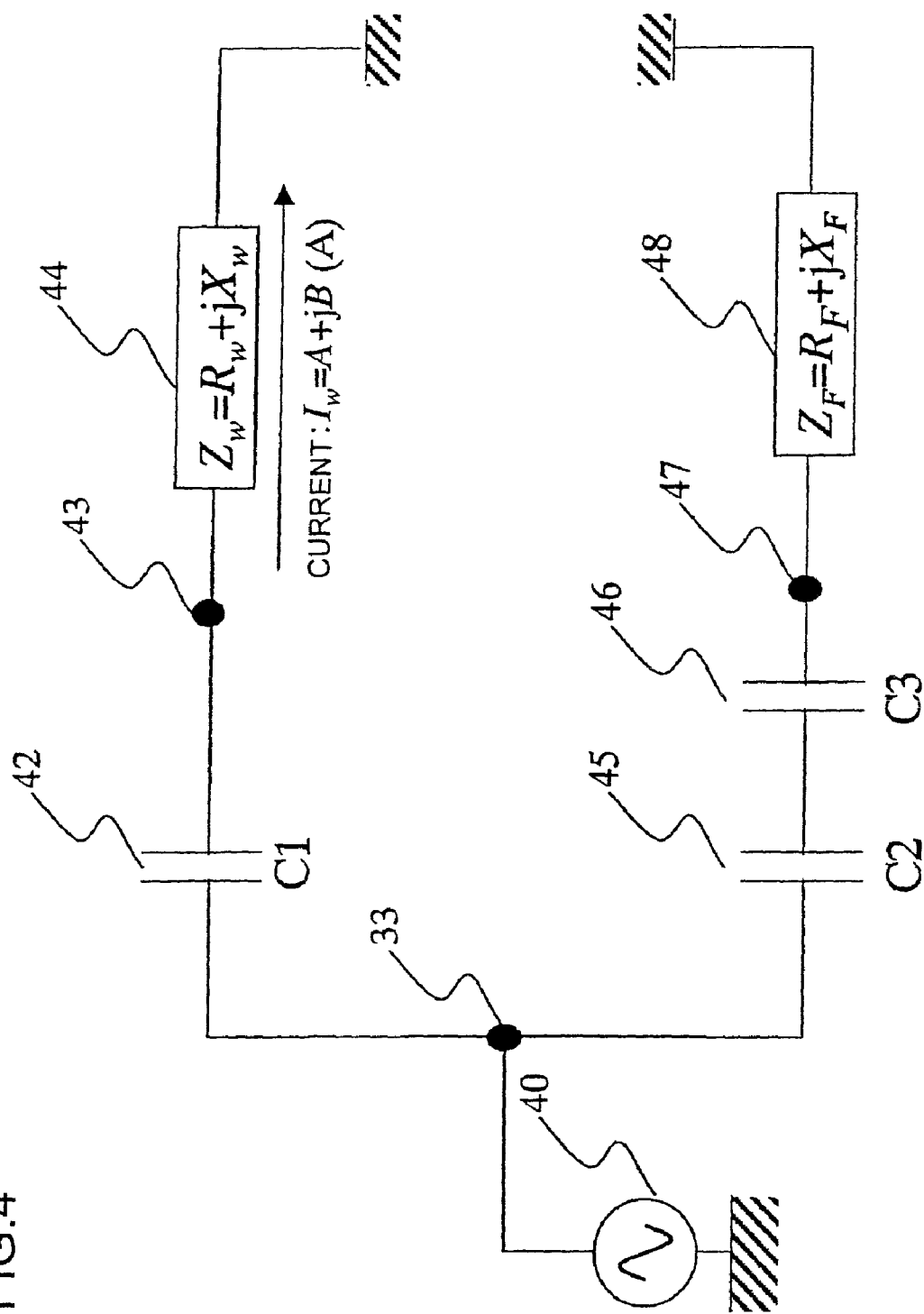
FIG. 4 shows the most simplified equivalent circuit corresponding to the first embodiment of the present invention.

The circuit illustrated in FIG. 4 is one example of the most simplified equivalent circuit corresponding to FIG. 3. Here, the RF power supply 40 is connected to the electrode 33. Power is supplied from the electrode 33 to the wafer surface 43 (wafer 30) via a capacitor 42 (C1) representing the electrostatic chucking dielectric film 34 formed on the electrode 33. The impedance 44 ($Z_W$) to the ground via the ion sheath 36 and plasma 37 seen from the wafer surface 43 can be expressed as $Z_W = R_W + jX_W$ for any impedance. Here, $R_W$ represents resistance component, j represents imaginary unit ($j^2 = -1$), and $X_W$ represents reactance (generic term for inductance and capacitance) component. Similarly, power to the focus ring 31 is supplied from the electrode 33 to the focus ring surface 47 via a capacitor 45 (C2) representing the dielectric film 34. The example of FIG. 4 corresponds to the case in which the focus ring is formed of a dielectric, and power is transmitted to the focus ring surface 47 via a capacitor 46 (C3) representing the dielectric focus ring 31. The load impedance 48 ($Z_F$) seen from the focus ring surface 47 can be expressed as $Z_F = R_F + jX_F$, similar to the case of the load impedance 44 ($Z_W$) seen from the wafer surface 43.

Here, $R_F$ represents resistance component, and $X_F$ represents reactance component. However, the equivalent circuit shown in FIG. 4 is a mere example, and it should be noted that any type of structure can be replaced with an equivalent circuit. The equivalent circuit is not only restricted to the simple one illustrated here, but can be replaced with a more complex circuit, such as two-dimensional or three-dimensional equivalent circuits. For any material and structure, the elements of the circuit are limited to a capacitor, a coil and a resistance, so the numerical analysis of the circuit is easy. The complexity of the equivalent circuit should be determined according to the necessary design accuracy. The aforementioned direct measurement using the network analyzer is very effective, since it is highly accurate and simplifies the equivalent circuit.

In FIG. 4, the current ($I_W$) seen from the surface voltage of the wafer surface 43 can be expressed as $I_W = A + jB$ (A), as illustrated in FIG. 4. The real part A of this current is known to correspond to the ion saturation current flowing into the wafer surface 43. The method for determining the electron density and electron temperature of plasma using this ion saturation current component has already been taught (refer for example to patent document 9). Thus, the designer can determine the plasma parameters with high accuracy by carrying out experiments and analysis regarding the process for optimizing focus ring structure.

Figure 5:
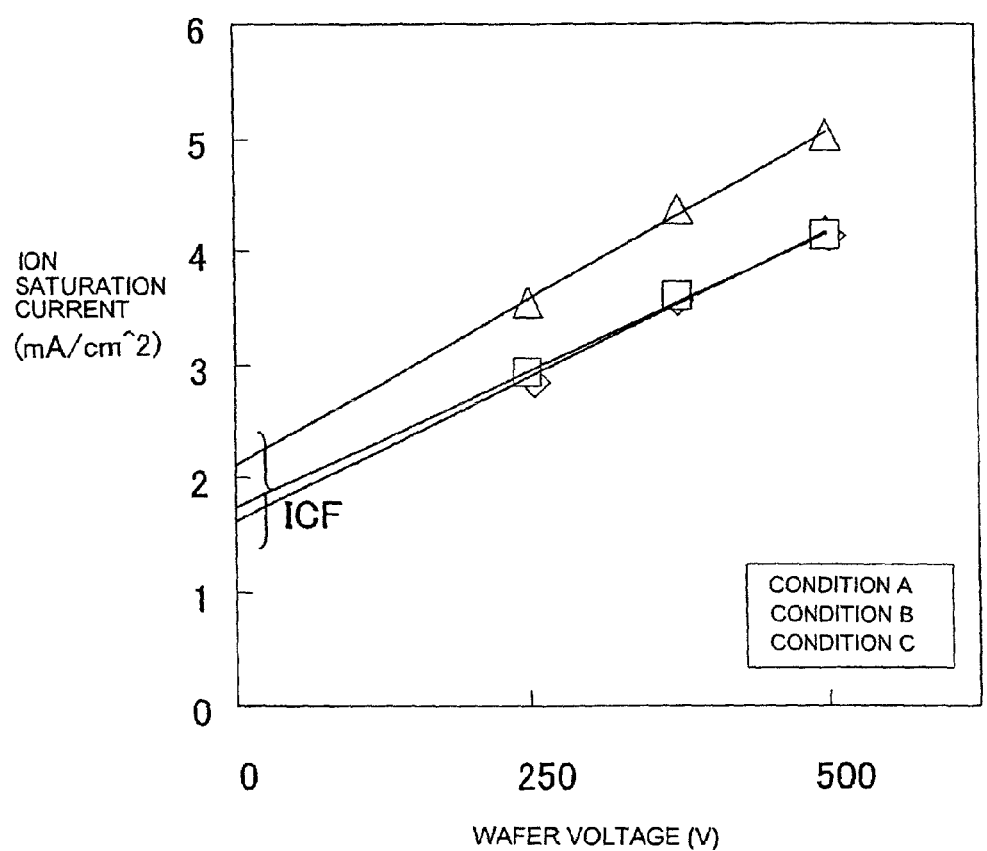
FIG. 5 is a graph showing an example for seeking a true ion saturation current by experiments.

FIG. 5 is an example of an experiment carried out to obtain the true ion saturation current (ICF) and the result of analyzing the same. When the electron temperature and electron density are achieved, the Debye length $\lambda_d$ of formula 2 can be computed easily based on the following formula 3, according to which formula 2 can be calculated.

[Formula 3]

$$\lambda_d = \sqrt{\frac{\varepsilon_0 T_e}{e n_0}} \quad (3)$$

wherein $\varepsilon_0$ represents the dielectric constant in vacuum, e represents elementary charge, and $n_0$ represents electron density.

Next, we will explain the method for determining the equivalent circuit of plasma and sheath and the impedance thereof. Note that by using the method disclosed in patent document 9, the designer can determine the total impedance of plasma and sheath without having to assemble a complex equivalent circuit or perform calculation. Through analysis of a few appropriate experimental data and creating a database based thereon, the designer can determine the necessary impedance by interpolation or extrapolation. It is important to handle plasma as an equivalent circuit, and it is not important what type of equivalent circuit is assembled. It is necessary to simply assemble an equivalent circuit that fulfills the necessary accuracy as a result.

Figure 6:
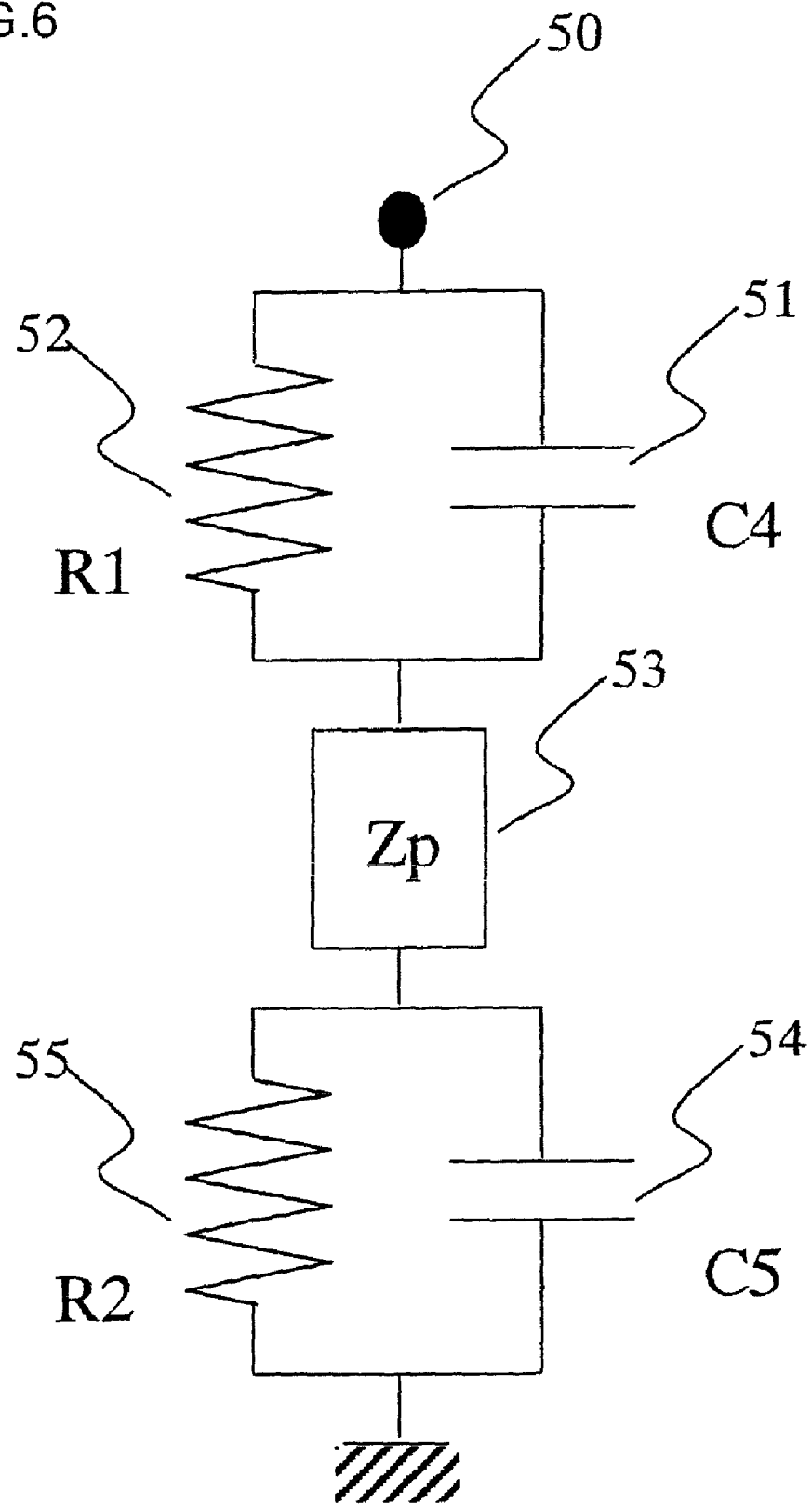
FIG. 6 is an equivalent circuit diagram of ion sheath and plasma.

Now, we will describe a simplified plasma-sheath equivalent circuit shown in FIG. 6. The load impedance seen from wafer (focus ring) surface 50 can be represented by connecting in series a parallel connection of the resistance component (R1) 52 of the ion sheath on the wafer (focus ring) surface and the condenser component (C4) 51, the impedance component (Zp) 53 of plasma, and a parallel connection of the resistance component (R2) 55 of the ion sheath on the ground surface and the capacitance component (C5) 54. Moreover, it is possible to represent the sheath resistance component with a diode, and it is possible to incorporate the plasma resistance, plasma capacitance and plasma inductance. As mentioned, it is important to form the equivalent circuit, but the type of the equivalent circuit being formed is not important as long as desired accuracy is achieved.

Using formula 2, the condenser component (C4) 51 on the wafer (focus ring) surface calculates the sheath thickness $d_{sh}$. The sheath voltage $V_{sh}$ is set to an appropriate assumed value, and the solution is computed by a convergent calculation mentioned later. When the sheath thickness is calculated, the capacitance $C_{sh}$ of the sheath can be computed easily based on the following formula 4.

[Formula 4]

$$C_{sh} = \frac{\varepsilon_0 S_{sh}}{d_{sh}} \quad (4)$$

wherein $S_{sh}$ represents the (wafer, focus ring) surface area of the sheath.

Next, regarding the resistance component (R1) 52 of the ion sheath on the wafer (focus ring) surface, it can be expressed by the following formula 5 by simply assuming that the ion saturation current flows by an average sheath voltage. ICF is the true ion saturation current calculated in FIG. 5.

[Formula 5]

$$R = \frac{ICF}{\frac{1}{\tau}\int_0^\tau V_{sh}(t)\,dx} \quad (5)$$

Further, the behavior of the electron current and ion current flowing into the wafer and focus ring is similar to the case of a double probe, so it is possible to use the theoretical formula for the double probe. According to the experience of the inventors, the double probe theory is more accurate. Further, it is also possible to use a single probe theory, but the result is not so different. The resistance component (R2) 55 of the ion sheath on the ground surface and the capacitance component (C5) 54 are also calculated by initially providing an appropriate voltage to the convergent calculation. Whether or not the plasma impedance (Zp) 53 should be evaluated depends on the RF frequency being used. If it is sufficiently smaller than the sheath impedance, it is negligible. The total impedance of the equivalent circuit of FIG. 6 mentioned above becomes the wafer load impedance 44 or the focus ring load impedance 48 of FIG. 4. Based on the described method, the equivalent circuit of FIG. 4 is completely capable of numerical analysis.

Figure 7:
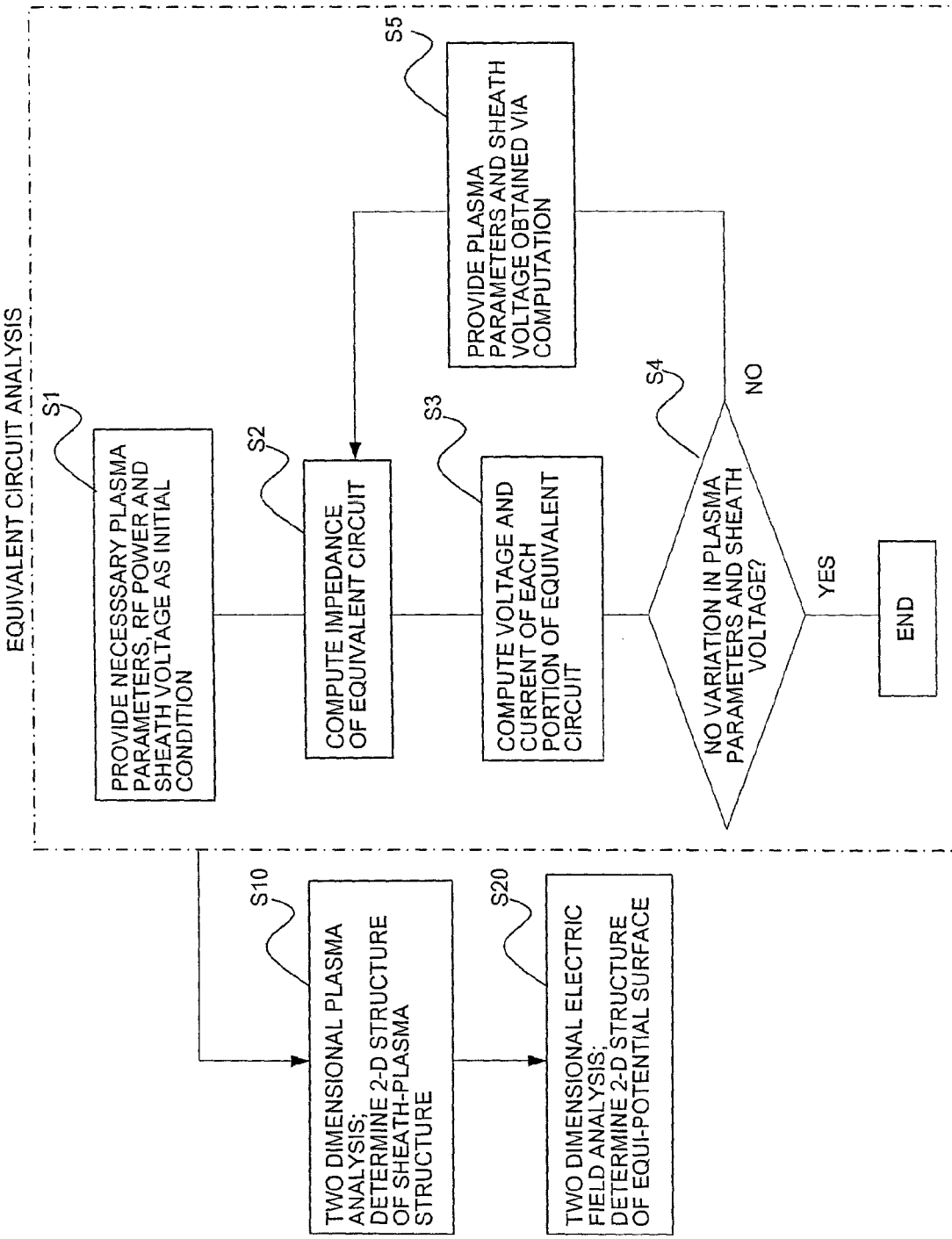
FIG. 7 is a flowchart showing an equivalent circuit analysis method.
Figure 8:
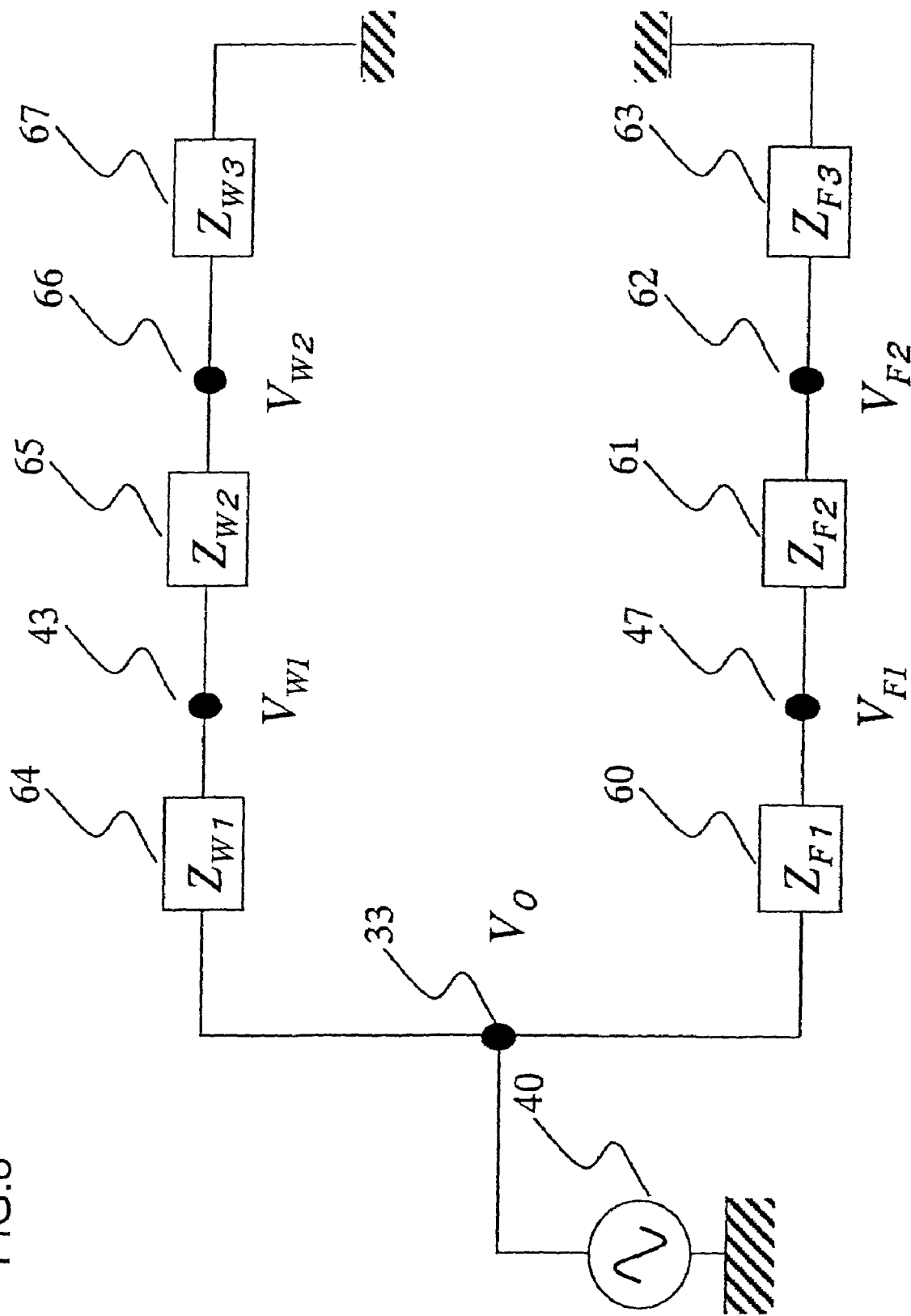
FIG. 8 is a modified equivalent circuit diagram for deriving a plasma-sheath interface flattening condition.

The steps of equivalent circuit analysis are described in FIG. 7. Here, the plasma parameters and sheath voltage given as initial conditions are subjected to convergent calculation. That is, the necessary plasma parameters, RF power and sheath voltage are provided as initial conditions (S1). Next, the impedance of the equivalent circuit is calculated (S2). Using the acquired impedance, the voltage and current of each part of the equivalent circuit are calculated, and based on these values, the plasma parameters and sheath voltage are calculated (S3). It is then determined whether the plasma parameters and sheath voltage provided in step S1 are equal to the plasma parameters and sheath voltage acquired by the calculation of step S3 (S4), and if they are not equal, the calculated plasma parameters and sheath voltage are provided (S5), and the procedure returns to step S2 where the impedance of the equivalent circuit is calculated using the calculated results. When in step S4 the given plasma parameters and sheath voltage are equal, the equivalent circuit analysis procedure is completed, and the convergent calculation is simply converged. As a result, the voltage on the surface of the wafer and focus ring and the sheath height thereof can be acquired.

If it is considered that the conditions for matching the sheath height on the focus ring and sheath height on the wafer are the most suitable conditions, it is sufficient to use the present equivalent circuit analysis. However, ion trajectory of the ions incident from the plasma depend not completely on the plasma-sheath interface conditions, but also on the electric field within the sheath. Therefore, in order to clarify the ion trajectory, it is necessary to perform sequential coupled analysis in the following order: two-dimensional plasma analysis (S10) and two-dimensional electric field analysis (S20) based on the result of the aforementioned equivalent circuit analysis. If necessary, interactive sequential coupled analysis can be performed between the two-dimensional plasma analysis and two-dimensional electric field analysis. Thereby, the electric field structure around the wafer and focus ring, including the electric field in the dielectric, can be determined. The codes for performing two-dimensional plasma analysis and two-dimensional electric field analysis are commercially available, and will not be described here.

Now, we will describe the conditions for flattening the plasma-sheath interface on the wafer surface and the plasma-sheath interface on the focus ring surface, or in other words, the plasma-sheath interface flattening conditions. The first one is described with reference to FIG. 8, which is a rewritten view of FIG. 4 in which the equivalent circuit is illustrated in a more understandable way. There are two routes through which power is transmitted from the electrode 33 connected to the RF power supply 40. The first route passes impedance 60 ($Z_{F1}$) between the electrode 33 (voltage $V_0$) and focus ring surface 47 (voltage $V_{F1}$), impedance 61 ($Z_{F2}$) between the focus ring surface 47 and plasma-sheath interface 62 (voltage $V_{F2}$) on the focus ring, impedance 63 ($Z_{F3}$) between plasma and ground, and reaches the ground. The second route passes impedance 64 ($Z_{W1}$) between the electrode 33 and wafer surface 43 (voltage $V_{W1}$), impedance 65 ($Z_{W2}$) between the wafer surface 43 and plasma-sheath interface 66 (voltage $V_{W2}$) on the wafer, impedance 67 ($Z_{W3}$) between the plasma and ground, and reaches the ground. At this time, the plasma space potential between adjacent focus ring and wafer must be equal. In other words, it is necessary that the following condition, $V_0-V_{W2}=V_0-V_{F2}$, must be fulfilled. This can be expressed by the following formula 6 or formula 7.

[Formula 6]

$$\frac{Z_{W1}+Z_{W2}}{Z_{W1}+Z_{W2}+Z_{W3}} = \frac{Z_{F1}+Z_{F2}}{Z_{F1}+Z_{F2}+Z_{F3}} \quad (6)$$

[Formula 7]

$$\frac{Z_{W3}}{Z_{W1}+Z_{W2}+Z_{W3}} = \frac{Z_{F3}}{Z_{F1}+Z_{F2}+Z_{F3}} \quad (7)$$

In other words, the voltage drop of the RF voltage from electrode 33 to plasma-sheath interface 66 above the wafer must be equal to the voltage drop of the RF voltage from electrode 33 to plasma-sheath interface 62 above the focus ring. The $Z_{F1}$ and $V_{W1}$ mentioned here include the impedance of dielectric film 34 on the surface of the electrode 33. It should be noted that the plasma-sheath interface flattening includes optimizing the structure and material property of the dielectric film 34.

The above-mentioned conditions do not necessarily assure that the plasma-sheath interface above the wafer surface and the plasma-sheath interface above the focus ring surface are flattened, and another additional condition is required. This is explained with reference to the marks shown in FIG. 3. The sum of the wafer surface height ($H_w$) measured from a certain height reference point 38 and the sheath thickness ($d_w$) above the wafer must equal the sum of the focus ring surface height ($H_{FR}$) measured from the same reference point 38 and the sheath thickness ($d_{FR}$) above the focus ring. This is expressed by the following formula 8.

[Formula 8]

$$H_w + d_w = H_{FR} + d_{FR} \quad (8)$$

Through use of the above-mentioned plasma-sheath model, equivalent circuit analysis and sheath flattening conditions, it is possible to determine the material and size of the actual structure. Hereafter, we will describe the contents of the invention based on preferred embodiments.

Figure 9:
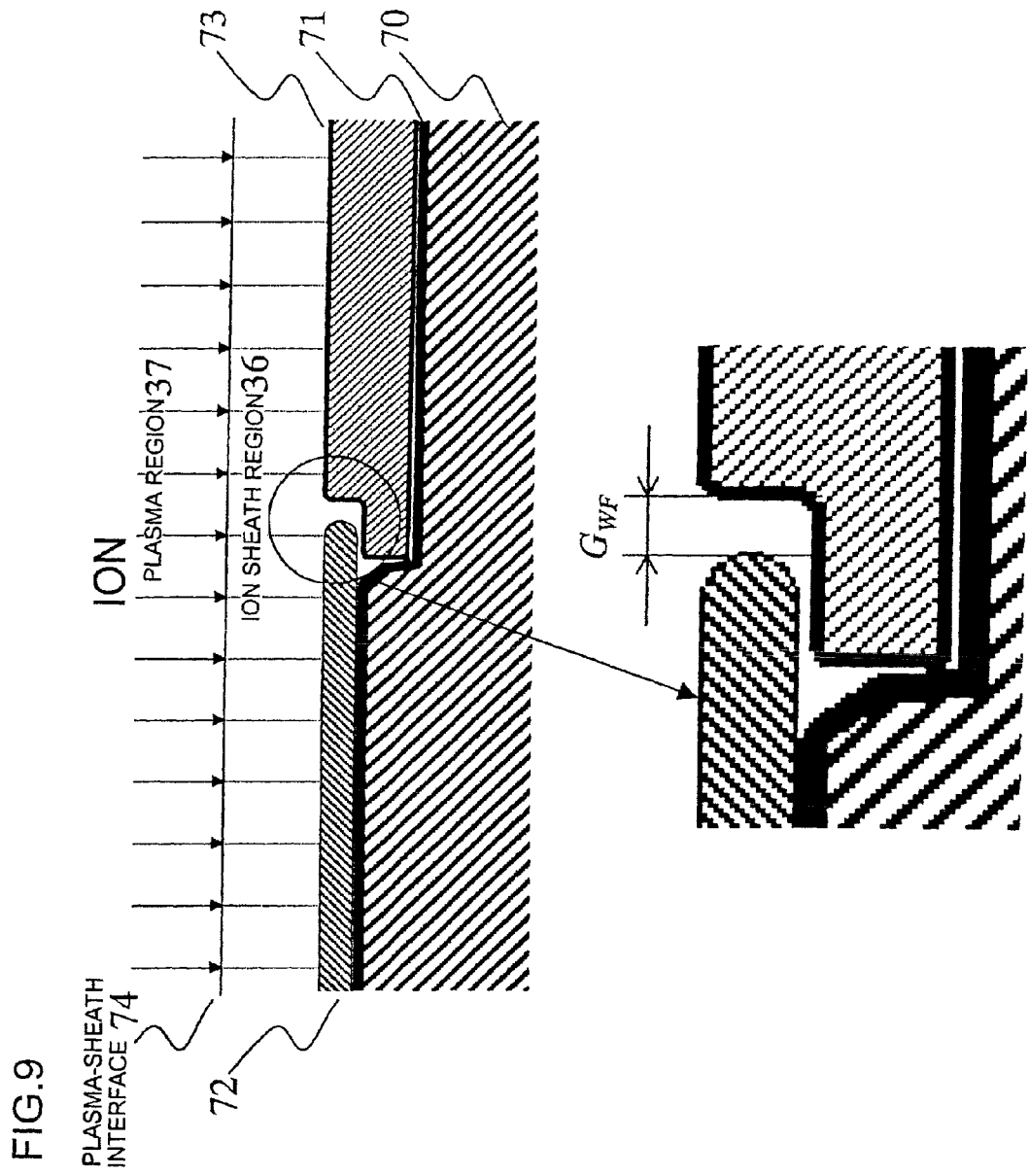
FIG. 9 is an enlarged cross-sectional view showing the area near the focus ring of the plasma processing apparatus corresponding to a second embodiment of the invention.

FIG. 9 illustrates a second embodiment of the present invention, in which a wafer 72 and a focus ring 73 are mounted on an electrode 70 having a dielectric film 71 for electrostatic chuck. A flat plasma-sheath interface 74 is formed above the wafer 72 and focus ring 73. The height of surfaces of the wafer 72 and the focus ring 73 are the same. In order to fulfill this condition, according to formula 8, $H_W = H_{FR}$ and $d_W = d_{FR}$. In other words, $V_0 - V_{W1} = V_0 - V_{F1}$. From these equations, the following formula is obtained.

[Formula 9]

$$\frac{Z_{W1}}{Z_{W1} + Z_{W2} + Z_{W3}} = \frac{Z_{F1}}{Z_{F1} + Z_{F2} + Z_{F3}} \quad (9)$$

By forming simultaneous equations of formulas 7 and 9, the following formula 10 is obtained. This is the plasma-sheath interface flattening condition of FIG. 9.

[Formula 10]

$$Z_{W1}:Z_{W2}:Z_{W3} = Z_{F1}:Z_{F2}:Z_{F3} \quad (10)$$

By assigning individual conditions into formulas 7 and 8, the plasma-sheath interface flattening conditions corresponding to those specific conditions can be obtained. At this time, a gap ($G_{WF}$) exists between the wafer and focus ring, and there is a precondition that this gap will not disturb the electric field in the sheath. Therefore, at least the following equation must be fulfilled, which is $0 < G_{WF} < d_W = d_{FR}$. As long as these conditions are fulfilled, the electrode 70, the dielectric film 71 and the focus ring 73 can be designed freely. As for materials, the electrode 70 must be a conductive material, but the dielectric film 71 can be formed of any material as long as it is dielectric, and the focus ring 73 can be formed of any material or any combination of materials. The ions being incident on the plasma-sheath interface 74 are accelerated perpendicularly to the plasma-sheath interface 74 and toward the wafer 72.

In order to prevent the generation of defective products caused by particles adhered on the surface of the wafer, the focus ring is operated in such a condition as to prevent reaction products generated by the wafer processing from depositing thereon. This is achieved by setting the surface voltage of the focus ring to exceed a given value, and to remove the reaction products by ion sputtering. This means that the focus ring itself is subjected to ion sputtering. In other words, the focus ring will be consumed and the height thereof will reduce with time. Here, if a focus ring is used starting from a state in which the plasma-sheath interface 74 is flat, the height of the focus ring 73 will be reduced along with the increase in operating time, and the process uniformity will be deteriorated at the wafer edge area. In order to extend the life of the focus ring while ensuring process performance, the height of the focus ring must be higher than that of the plasma-sheath interface flattening condition shown in FIG. 9. Thus, a sheath height difference $d_{of}$ is defined by the following formula 11, and the relationship between the sheath height difference and the etch rate uniformity at the wafer edge area was sought by experiment.

[Formula 11]

$$d_{of} = (H_W + d_w) - (H_{FR} + d_{FR}) \quad (11)$$

Figure 10:
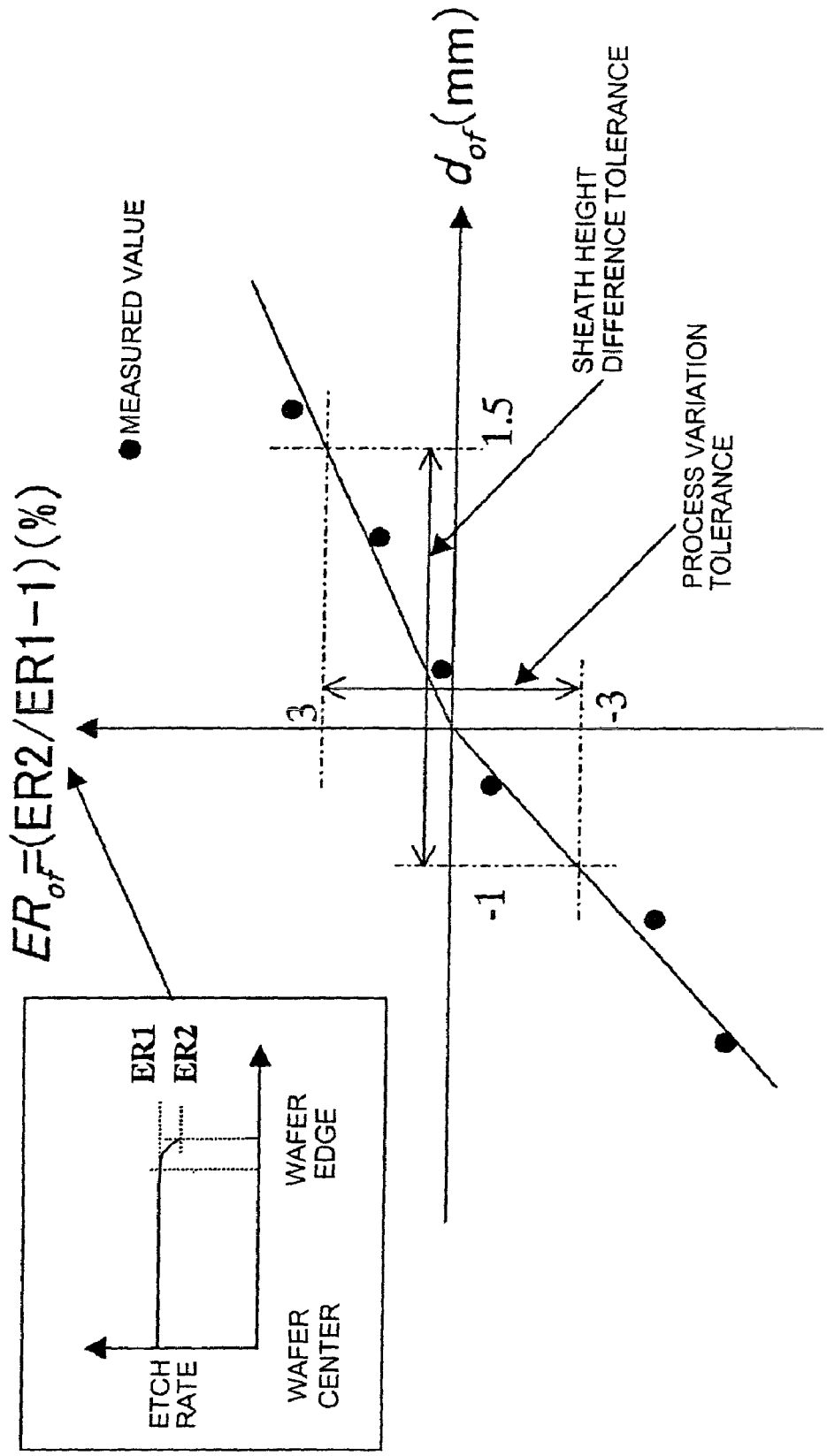
FIG. 10 is a graph showing the relationship between a tolerance of process variation and a tolerance of sheath height difference.

The result is shown in FIG. 10. FIG. 10 shows the sheath height difference on the horizontal axis and plots the etch rate uniformity on the vertical axis. The definition of etch rate uniformity $ER_{of}$ is shown in FIG. 10. As illustrated, there is a certain correlation between the sheath height difference and etch rate uniformity, and an approximation straight line can be drawn toward the positive and negative directions, respectively. If the tolerance of the etch rate uniformity at the wafer edge area is +−3%, the tolerance of the sheath height difference is approximately +1.5 to −1.0 mm. When the focus ring material is formed of a conductive material, the dimension thereof regarding the tolerance of the sheath height difference can be determined by adjusting the thickness of the focus ring. This is because the surface voltage of a conductor will not change even when the height thereof is changed. If the focus ring is made of a dielectric or semiconductor material, the tolerance of the sheath height difference can be converted to a tolerance of a focus ring surface voltage through use of formula 2, and the necessary impedance and consequently the focus ring structure can be computed via equivalent circuit analysis.

Regardless of the material of the focus ring, when a new focus ring is disposed, the thickness of the focus ring is determined so that the plasma-sheath interface above the focus ring is higher than the plasma-sheath interface above the wafer for a height corresponding to the tolerance of the sheath height difference, as illustrated in FIG. 11(a) showing the third embodiment of the present invention. At this time, as shown in the circled portion of the drawing, the height difference of the plasma-sheath interface acts as a spherical lens for diverging ions with respect to the wafer. When the height of the plasma-sheath interface above the focus ring is reduced to the lowest tolerance from the plasma-sheath interface above the wafer due to consumption, the focus ring reaches its application limit, and will have to be replaced. At this time, as shown in the circled portion of the drawing, the height difference of the plasma-sheath interface acts as a spherical lens focusing the ions with respect to the wafer. By designing the focus ring as described, if the tolerance is set as shown in FIG. 10, for example, the consumable amount of height of the focus ring is approximately 2.5 mm. If the focus ring has the most preferable height from the beginning as shown in FIG. 9, the consumable amount of height of the focus ring is only approximately 1 mm, so by setting the tolerance as mentioned, the life of the focus ring is extended by approximately 2.5 times. The advantage here is that the supplies expenses regarding semiconductor fabrication is reduced as a result. However, the tolerance of a process that determines the basic value of the design must be determined to correspond to each process from the viewpoint of securing product performance, so it cannot be designed specifically in advance for the apparatus. The design of the focus ring must be determined after determining the mass-production processes.

Figure 12:
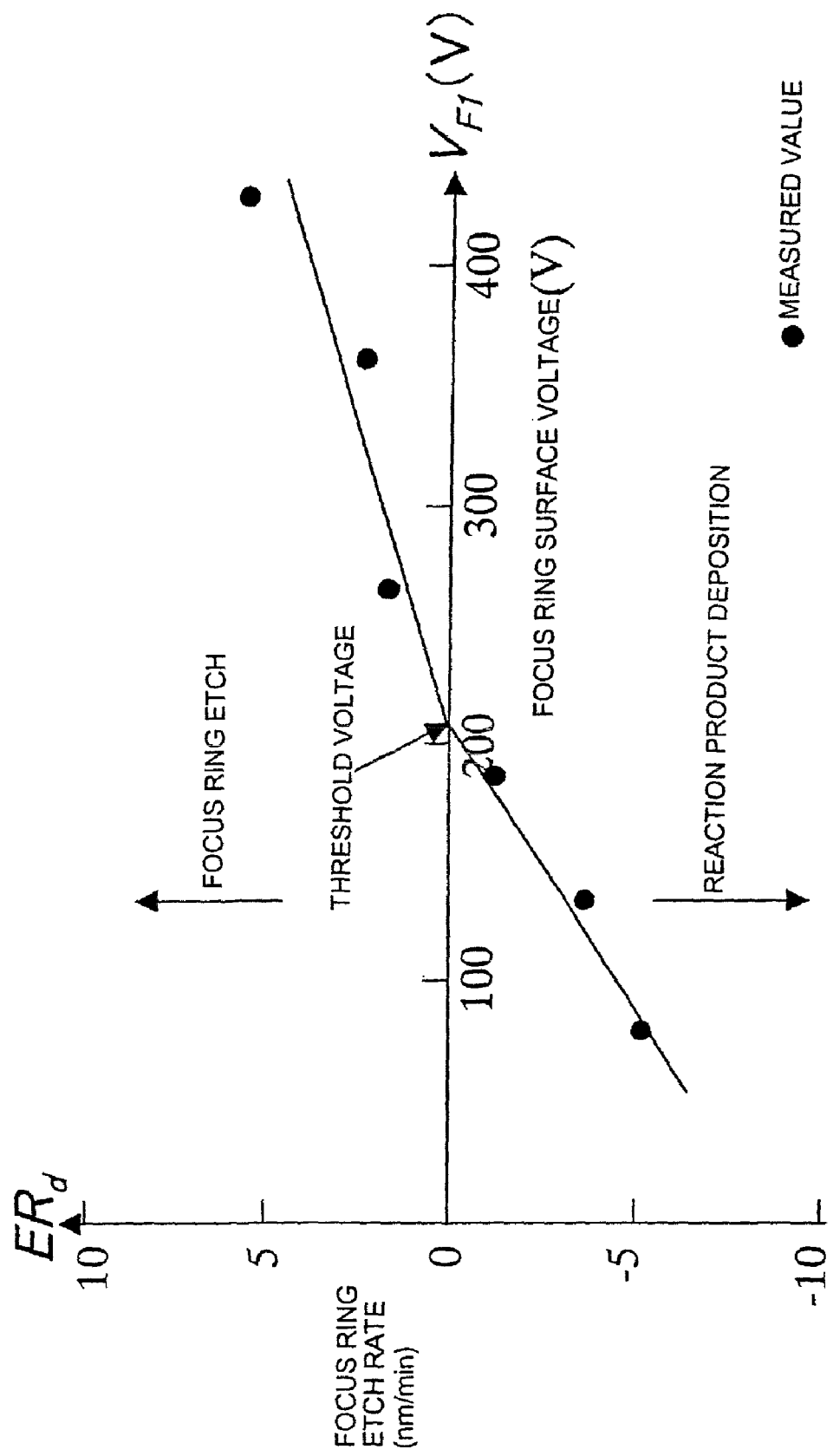
FIG. 12 is a graph showing the relationship between the focus ring surface voltage and the focus ring etch or the deposition of process reaction products on the focus ring.

The wafer surface voltage is an extremely important factor for ensuring the performance of the process. On the other hand, the focus ring surface voltage is an important factor for determining the life of the focus ring or the plasma gas component control related to sputtering of the focus ring. Moreover, it also determines whether reaction products caused during processing is deposited on the focus ring surface or not. FIG. 12 shows the relationship between the focus ring surface voltage ($V_{F1}$) and focus ring etching rate ($ER_d$) of a quarts focus ring when a plasma generated from an Ar/$C_5F_8$ gas of 2.0 Pa and having an electron density corresponding to approximately $8\times10^{-16}$ m$^{-3}$ is generated. It is shown here that reaction products are deposited when the $ER_d$ was of negative value. In this example, the threshold voltage of reaction product deposition was approximately 210 V. Under such conditions, we will consider a case in which it is preferable to have the focus ring consumption held down to a minimum while applying a sufficiently high RF bias to the wafer. In other words, $V_{W1}$ is greater than $V_{F1}$ ($V_{W1}>V_{F1}$) wherein wafer surface voltage is $V_{W1}$ and focus ring surface voltage is $V_{F1}$. At this time, according to formula 2 (use $V_{W1}$ or $V_{F1}$ instead of $V_{sh}$), $d_W$ is greater than $d_{FR}$ ($d_W>d_{FR}$). Since the wafer and focus ring are separated by only approximately a few mm, there is no difference in plasma parameters between them, and the sheath thickness difference is caused by the surface voltage difference. At this time, formula 8 is transformed to obtain formula 12.

[Formula 12]

$$d_w - d_{FR} = H_{FR} - H_W \quad (12)$$

Figure 13:
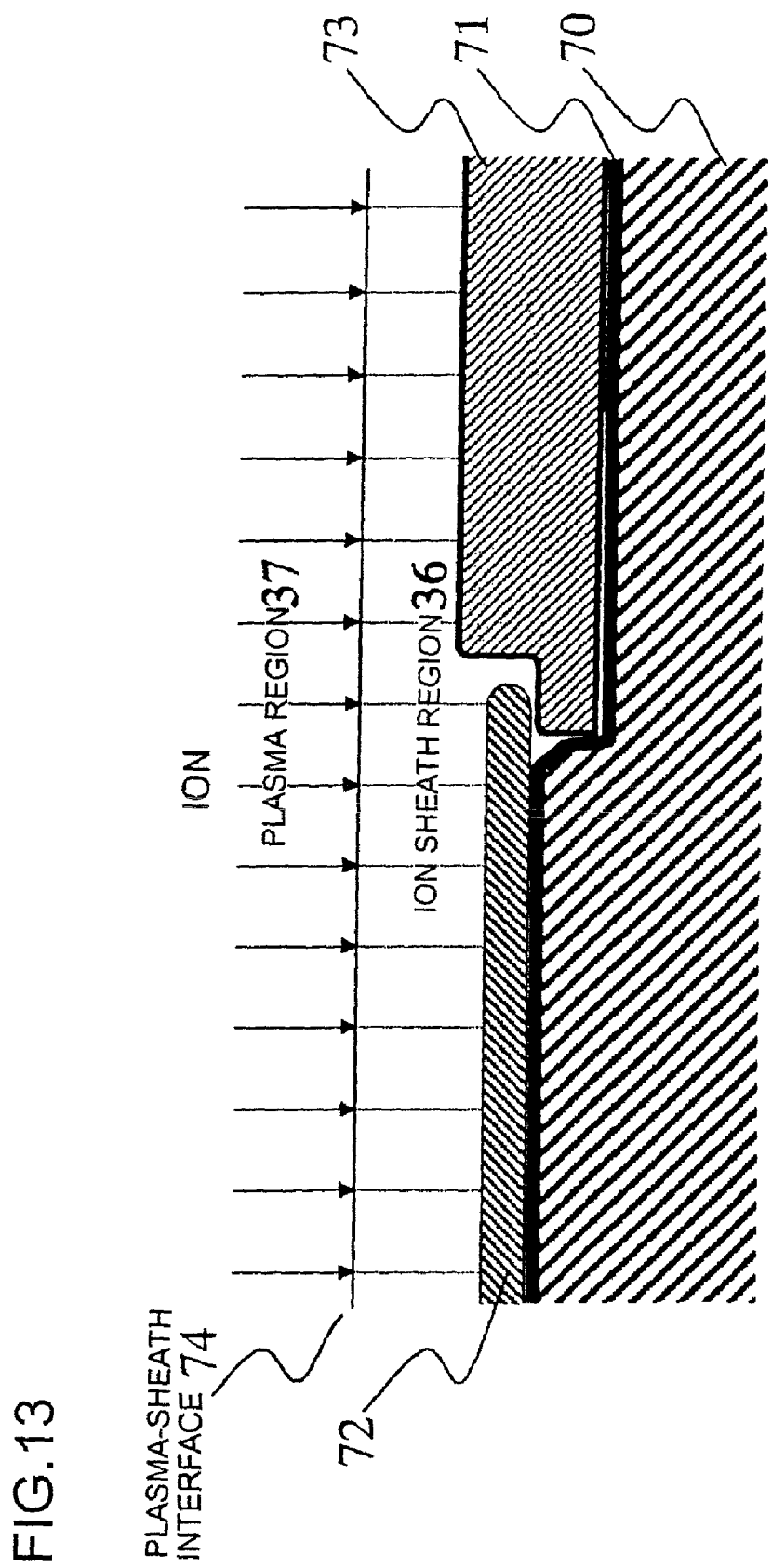
FIG. 13 is an enlarged cross-sectional view showing the area near a focus ring of a plasma processing apparatus corresponding to a fourth embodiment of the present invention.

The above formula shows that when the sheath thickness above the wafer and the sheath thickness above the focus ring differ, the difference must be absorbed by adjusting the wafer and focus ring heights. This is the plasma-sheath interface flattening condition in case where $V_{W1}>V_{F1}$. FIG. 13 illustrates this condition, which is the fourth embodiment of the present invention. Naturally, the precondition $0<G_{WF}<d_{FR}<d_W$ must be fulfilled. Regarding the structure shown in FIG. 13, the height of the focus ring 73 can be redesigned corresponding to the process variation tolerance described in FIG. 10 in order to determine the final structure of the focus ring 73.

Figure 11:
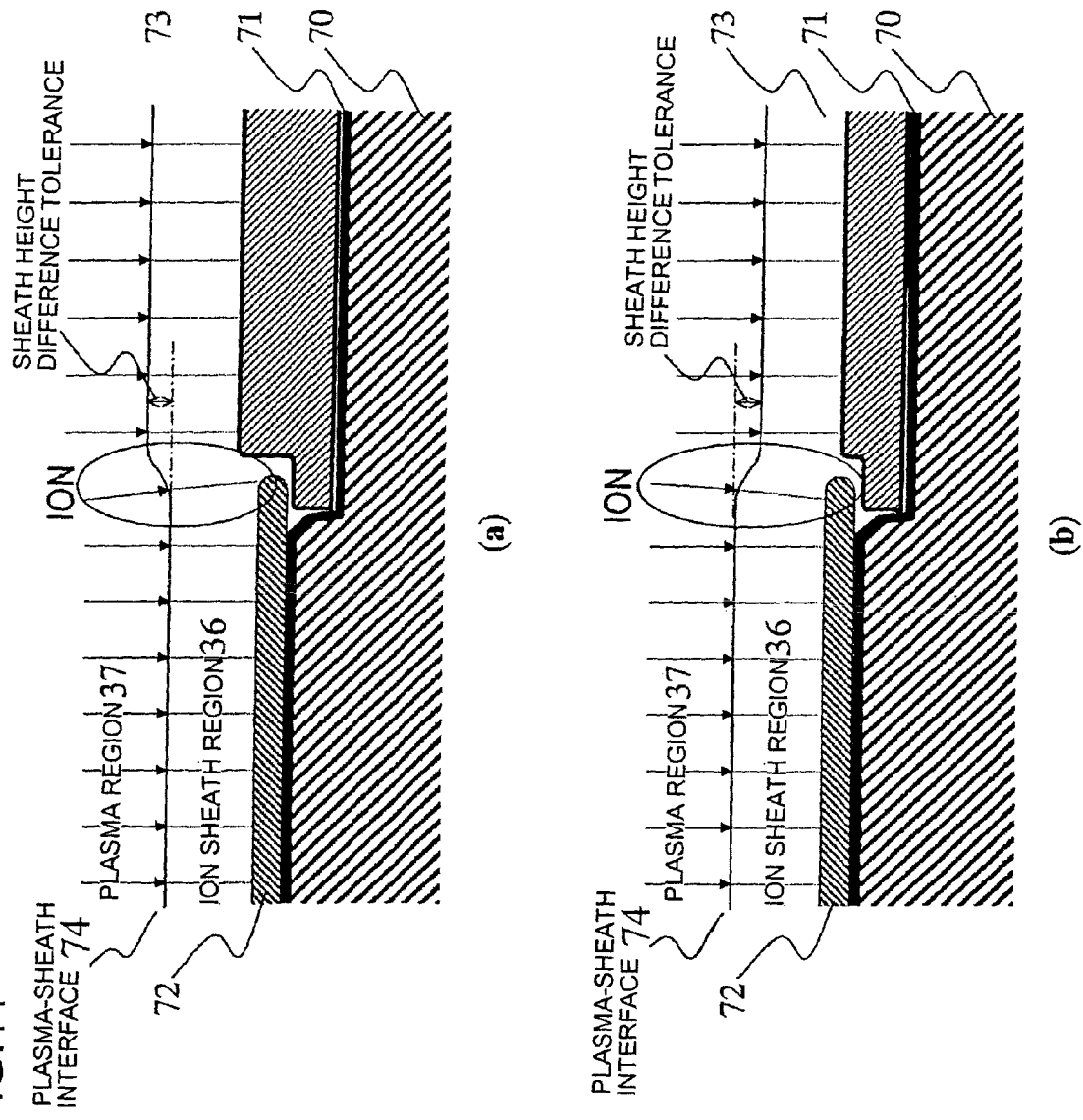
FIG. 11 shows a third embodiment of the present invention, wherein (a) shows a final focus ring structure taking into consideration a tolerance of process variation, and (b) shows a focus ring structure at the end of its life, having designed to take into consideration the tolerance of process variation.
Figure 14:
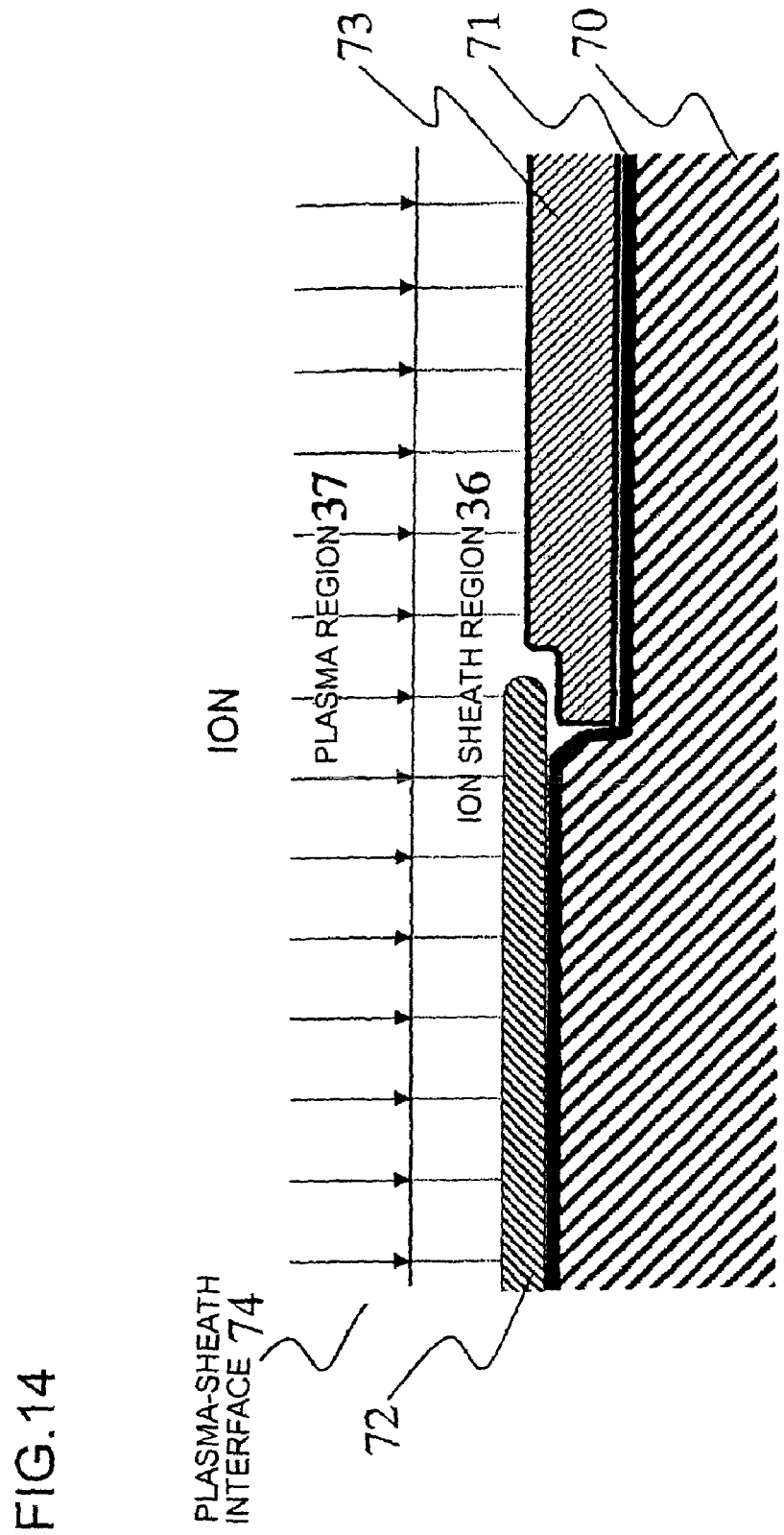
FIG. 14 is an enlarged cross-sectional view showing the area near a focus ring of a plasma processing apparatus corresponding to a fifth embodiment of the present invention.

When $V_{W1}=V_{F1}$, the contents described with reference to FIG. 9 is the plasma-sheath interface flattening conditions, and FIG. 11 is the final structure. Next, we will consider a case where $V_{W1}<V_{F1}$. This corresponds for example to a case where sufficient RF bias is applied to the focus ring while it is not preferable to apply much RF bias to the wafer when the gas-phase component in the plasma is actively manipulated through vapor phase reaction caused by the surface reaction of the focus ring or reaction products caused by the focus ring. Even in this case, formula 12 is effective, and the heights of the wafer and the focus ring must be adjusted when there is a height difference in the sheath thickness above the wafer and sheath thickness above the focus ring. This is the plasma-sheath interface flattening condition when $V_{W1}<V_{F1}$. FIG. 14 illustrates this state, which is the fifth embodiment of the present invention. Naturally, the precondition $0<G_{WF}<d_W<d_{FR}$ must be fulfilled. Regarding the structure shown in FIG. 14, the height of the focus ring 73 can be redesigned corresponding to the process variation tolerance described in FIG. 10 in order to determine the final structure of the focus ring 73.

Figure 15:
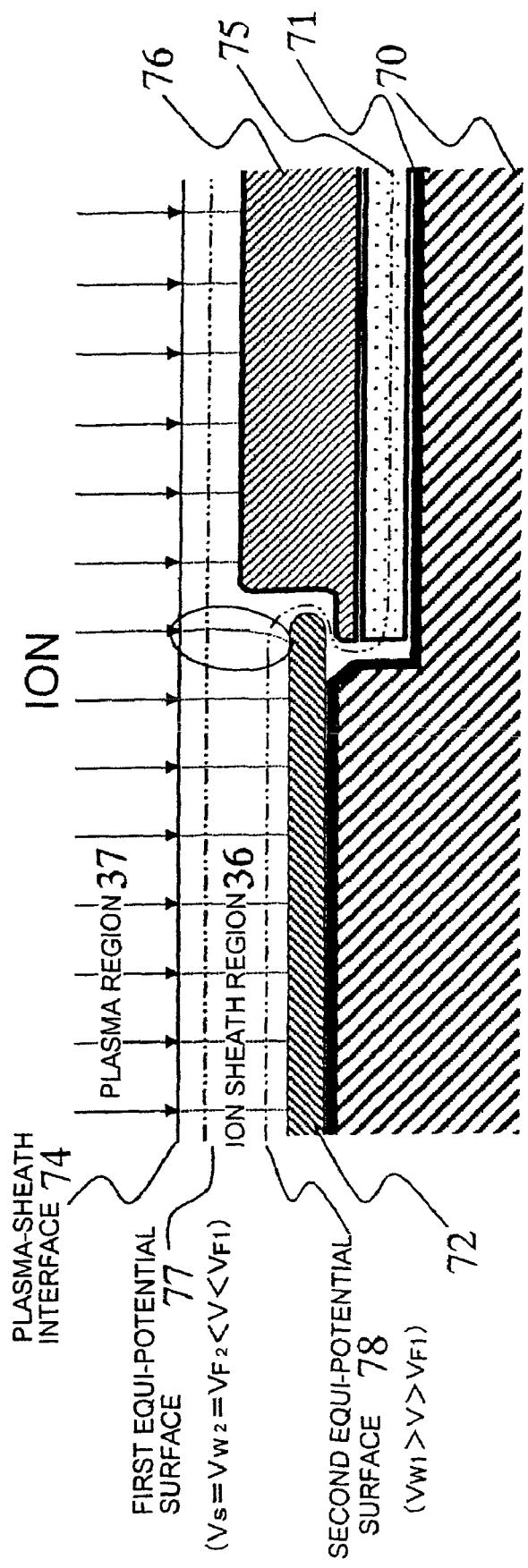
FIG. 15 is an enlarged cross-sectional view showing the area near a focus ring of a plasma processing apparatus corresponding to a sixth embodiment of the present invention.

Now, the sixth embodiment of the present invention is described with reference to FIG. 15. According to this embodiment, a focus ring 76 made of a conductive material and a wafer 72 are disposed on an electrode 70 having a dielectric film 71 for electrostatic chuck. Further, a dielectric layer 75 is formed between the focus ring 76 and the dielectric film 71. A flat plasma-sheath interface 74 exists above the wafer 72 and focus ring 76. Therefore, the present embodiment fulfills the conditions of formula 7, formula 8 and formula 12, and the design fulfills $V_{W1}>V_{F1}$. Further, the precondition $0<G_{WF}<d_W<d_{FR}$ is also fulfilled. Now, the two-dimensional plasma analysis and two-dimensional electric field analysis explained with reference to FIG. 7 are carried out, by which the ion sheath and the electric field structure within the dielectric body are analyzed. Here, a first equipotential surface 77 of V that fulfills the equation $V_s = V_{w2} = V_{F2} < V < V_{F1}$ and a second equi-potential surface 78 of V that fulfills the equation $V_{W1} > V > V_{F1}$ are shown as examples of the equi-potential surface. The first equi-potential surface 77 existing above the wafer 72 and focus ring 76 passes below the plasma-sheath interface 74, and it has a substantially flat plane. However, the second equi-potential surface 78 is bent drastically at the edge of the wafer 72 and curves in toward the back surface of the wafer. This is because the focus ring 76 is made of a conductor and the voltage at various areas of the focus ring 76 equals $V_{F1}$.

As a result, it was discovered that the second equi-potential surface 78 passed through the very narrow gap between the back surface of the wafer 72 and the focus ring 76, and further between the focus ring 76 and the dielectric film 71 before entering the dielectric layer 71. As a result, as illustrated in the circled area in FIG. 15, the ions entering this area are accelerated perpendicularly toward the wafer until they reach the first equi-potential surface 77, but when they reach the height near the second equi-potential surface 78, they are accelerated also toward the center of the wafer. In other words, the drawing shows that ion convergence is performed near the wafer edge by the electric field in the sheath. Whether or not this ion convergence affects the process uniformity near the wafer edge depends on the process, but it shows that further optimization is necessary, including the electric field structure within the sheath. Naturally, regarding the structure of FIG. 15, the height of the focus ring 76 can be redesigned corresponding to the process variation tolerance described in FIG. 10 in order to determine the final structure of the focus ring 76.

Figure 16:
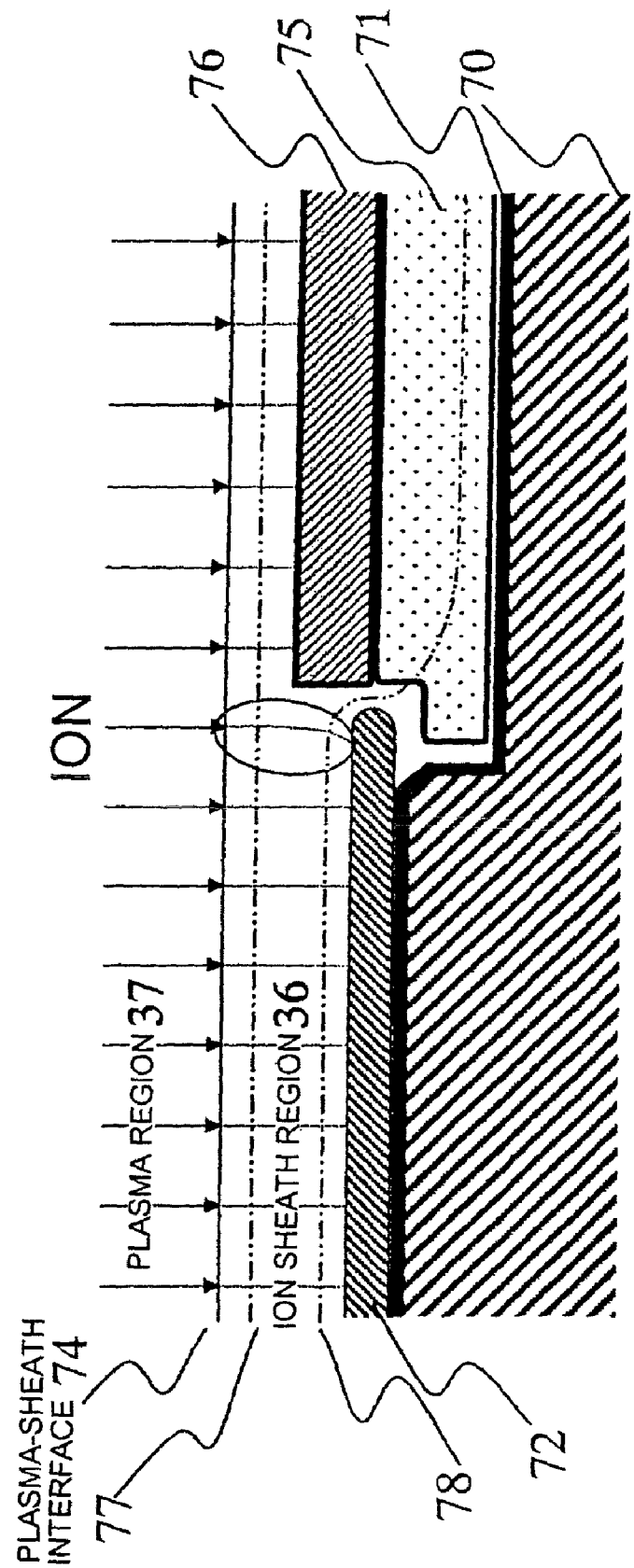
FIG. 16 is an enlarged cross-sectional view showing the area near a focus ring of a plasma processing apparatus corresponding to a seventh embodiment of the present invention.

FIG. 16 illustrating a seventh embodiment of the present invention will now be described, which is an improvement of the sixth embodiment. The difference between this embodiment and the embodiment of FIG. 15 is that the shapes of the focus ring 76 and dielectric layer 75 are different. Other than that, both adopt the same design, including the conditions. Now, two dimensional plasma analysis and two dimensional electric field analysis were carried out in a manner similar to the sixth embodiment, by which the electric field structure within the ion sheath and the dielectric body were analyzed. As a result, the first equi-potential surface 77 was substantially flat, similar to the sixth embodiment. The second equi-potential surface 78 was found to enter the dielectric layer 71 from the edge of the wafer 72. As a result, the ion convergence in the circled area of FIG. 16 was somewhat improved than that of the sixth embodiment. Naturally, regarding the structure of FIG. 16, the height of the focus ring 76 can be redesigned corresponding to the process variation tolerance described in FIG. 10 in order to determine the final structure of the focus ring 76.

Figure 17:
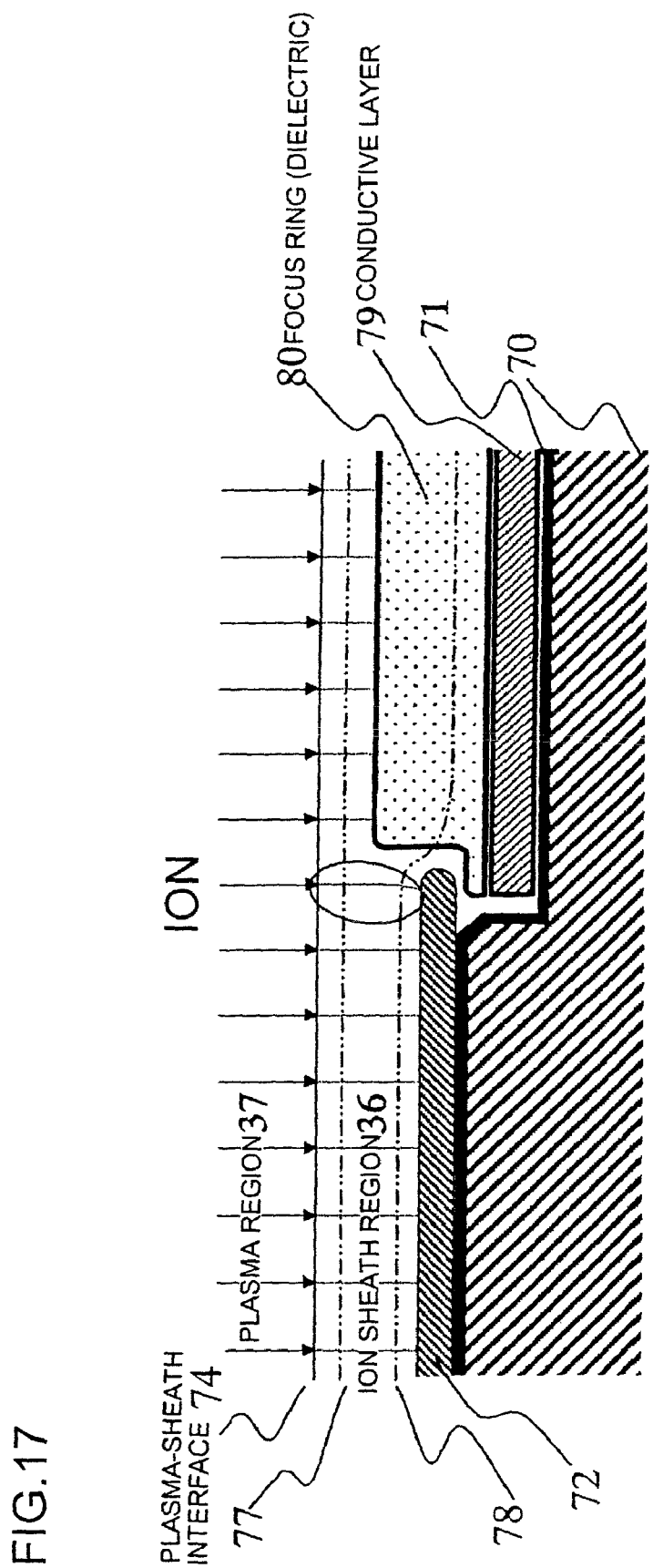
FIG. 17 is an enlarged cross-sectional view showing the area near a focus ring of a plasma processing apparatus corresponding to an eighth embodiment of the present invention.

FIG. 17 illustrating an eighth embodiment of the present invention will now be described, which is an improvement of the sixth embodiment. The difference between this embodiment and the embodiment of FIG. 15 is that the focus ring 80 is formed of a dielectric and that a conductive layer 79 is disposed in the present embodiment. Other than that, both adopt the same design, including the conditions. Now, two dimensional plasma analysis and two dimensional electric field analysis were carried out in a manner similar to the sixth embodiment, by which the electric field structure within the ion sheath and the dielectric body were analyzed. As a result, the first equi-potential surface 77 was substantially flat, similar to the sixth embodiment. The second equi-potential surface 78 was found to enter the dielectric focus ring 80 from the edge of the wafer 72. As a result, the bending of the second equi-potential surface at the wafer edge was further reduced, and the ion convergence in the circled area of FIG. 17 was greatly improved than that of the sixth embodiment. Naturally, regarding the structure of FIG. 17, the height of the focus ring 80 can be redesigned corresponding to the process variation tolerance described in FIG. 10 in order to determine the final structure of the focus ring 80.

Figure 18:
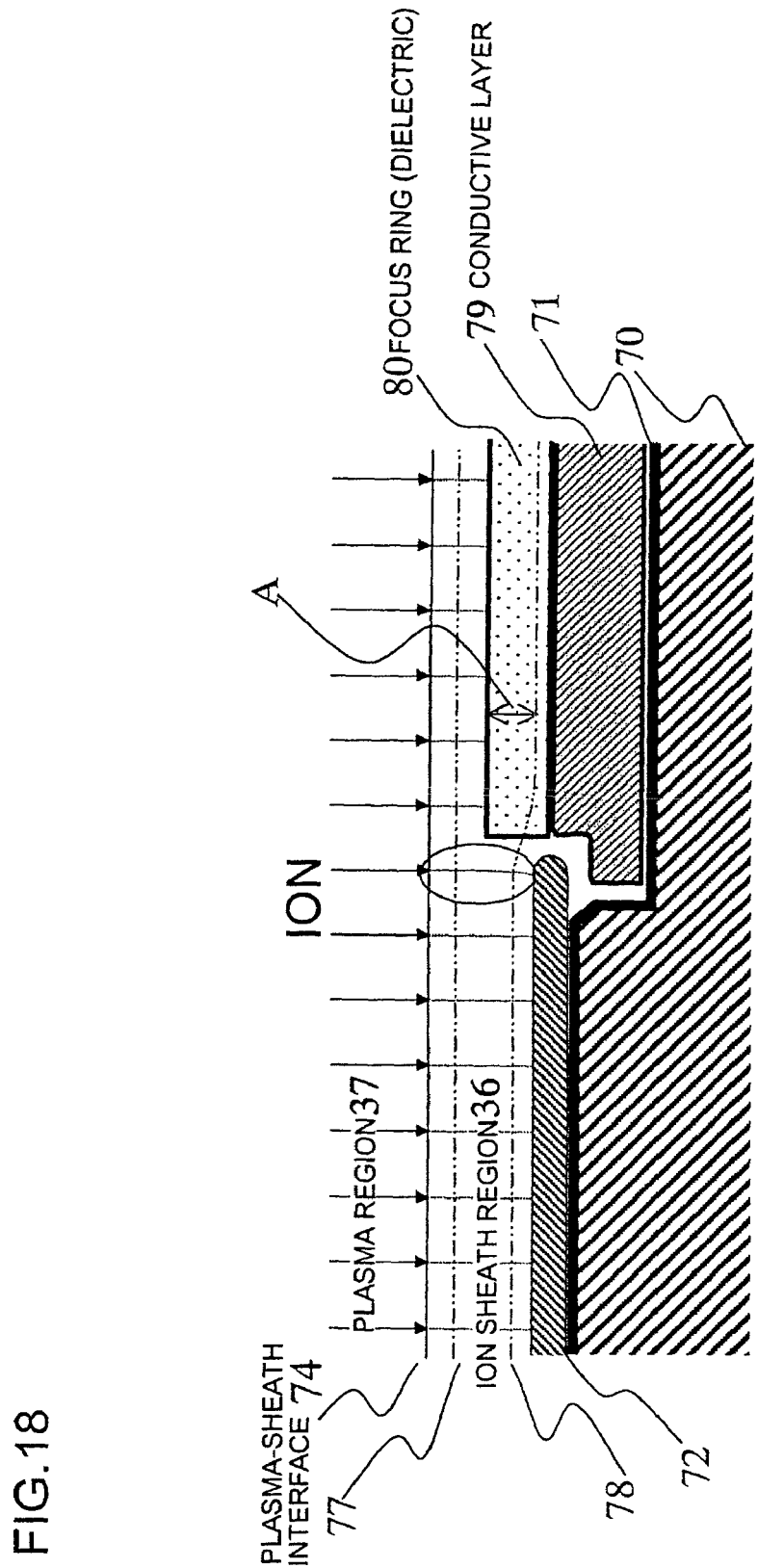
FIG. 18 is an enlarged cross-sectional view showing the area near a focus ring of a plasma processing apparatus corresponding to a ninth embodiment of the present invention.

FIG. 18 illustrating a ninth embodiment of the present invention will now be described, which is an improvement of the seventh and eighth embodiments. The difference between this embodiment and the embodiment of FIG. 16 is that the focus ring 80 is formed of a dielectric and that a conductive layer 79 is disposed in the present embodiment. Other than that, both adopt the same design, including the conditions. Now, two dimensional plasma analysis and two dimensional electric field analysis were carried out in a manner similar to the sixth embodiment, by which the electric field structure within the ion sheath and the dielectric member were analyzed. As a result, the first equi-potential surface 77 was substantially flat, similar to the sixth embodiment. The second equi-potential surface 78 was found to enter the dielectric focus ring 80 from the edge of the wafer 72. As a result, the bending of the second equi-potential surface at the wafer edge was even further flattened than FIG. 17. Thus, the ion convergence in the circled area of FIG. 18 was even further improved than those of the seventh and eighth embodiments. Naturally, regarding the structure of FIG. 18, the height of the focus ring 80 can be redesigned corresponding to the process variation tolerance described in FIG. 10 in order to determine the final structure of the focus ring 80. Here, it is impossible to completely flatten the second equi-potential surface 78. In order for the second equi-potential surface to be completely flat, the material of the dielectric focus ring disposed above the second equi-potential surface shown in FIG. 18 must have a relative dielectric constant of 1, but it is impossible to acquire a solid dielectric body having such property. The second equi-potential surface is completely flattened only when the structure of FIG. 9 is adopted and the plasma-sheath interface flattening conditions related to the structure are fulfilled.

As shown in FIGS. 17 and 18, adopting a dielectric member as the focus ring causes another advantageous result. If the focus ring is a conductor, the surface voltage $V_{F1}$ is equal across the whole body. This means that if the height of the focus ring made of a conductor is reduced by 2 mm due to consumption, for example, the plasma-sheath interface above the focus ring is also lowered by 2 mm. In other words, the amount of consumption of the focus ring is reflected directly in the sheath height difference $d_{of}$. However, if the focus ring is formed of a dielectric, the reduction of height of the focus ring due to consumption causes the surface voltage $V_{F1}$ to increase. Thus, the sheath thickness is increased, and the lowering of the plasma-sheath interface above the focus ring becomes smaller than the lowering of height of the focus ring. This phenomenon is more significant when the dielectric material has larger voltage drop in the dielectric body. In other words, it is more advantageous to use a dielectric having low relative dielectric constant.

Figure 19:
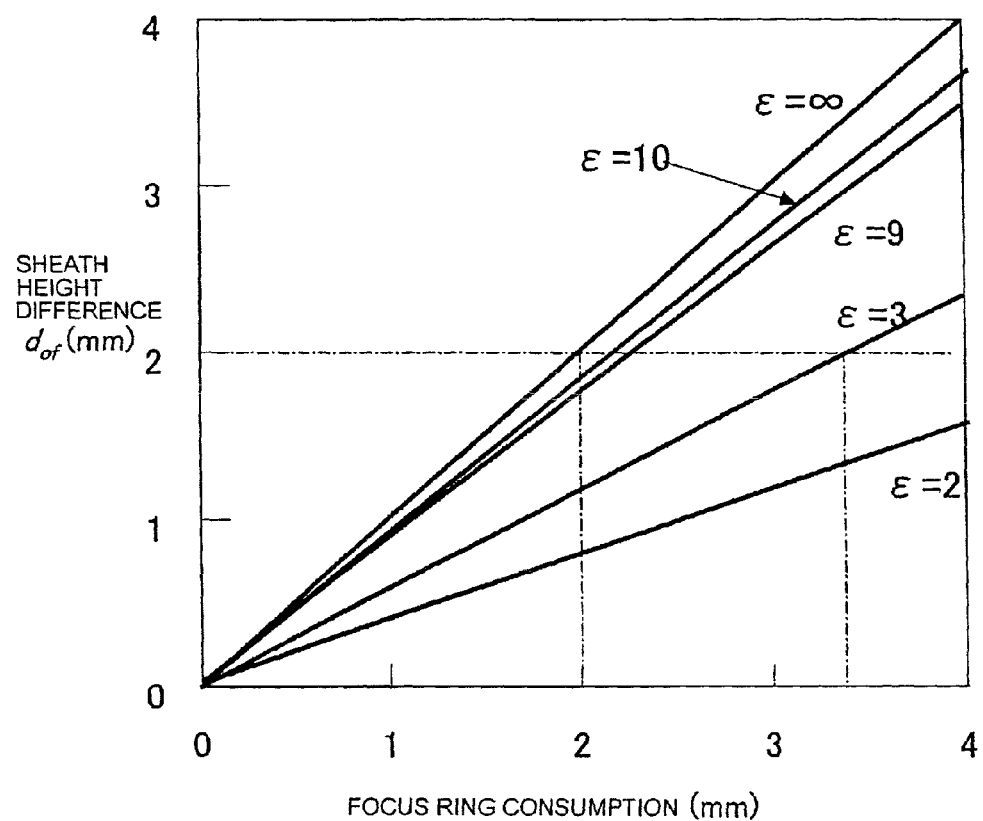
FIG. 19 is a graph showing a relative dielectric constant dependency of the relationship between focus ring consumption and sheath height difference.

The above-mentioned example was analyzed via equivalent circuit, and the relationship between the focus ring consumption and the sheath height difference $d_{of}$ was examined. The result is shown in FIG. 19. Here, relative dielectric constant $\epsilon = \infty$ denotes a perfect conductor. It is assumed that the tolerance of the sheath height difference explained in FIG. 10 is 2 mm, for example. In the case of a conductive focus ring, the consumption tolerance of the focus ring is 2 mm. However, in the case of a dielectric having a relative dielectric constant of $\epsilon = 3$, the consumption tolerance of the focus ring reaches 3.4 mm. The consumption rate of the focus ring differs according to the material and the applied process, so it depends, but the structure can be further optimized by designing the focus ring keeping in mind that it is more advantageous for the relative dielectric constant to be smaller. It can be recognized from the present drawing that by using a dielectric focus ring having a relative dielectric constant of 10, the consumption tolerance of the focus ring is increased by approximately 10% compared to using a conductive focus ring. Though 10% may seem like a small amount, the cost of the focus ring is a major factor in the cost of consumables related to the fabrication of semiconductor products, the reduction thereof can contribute unfailingly to the improvement of productivity.

Figure 20:
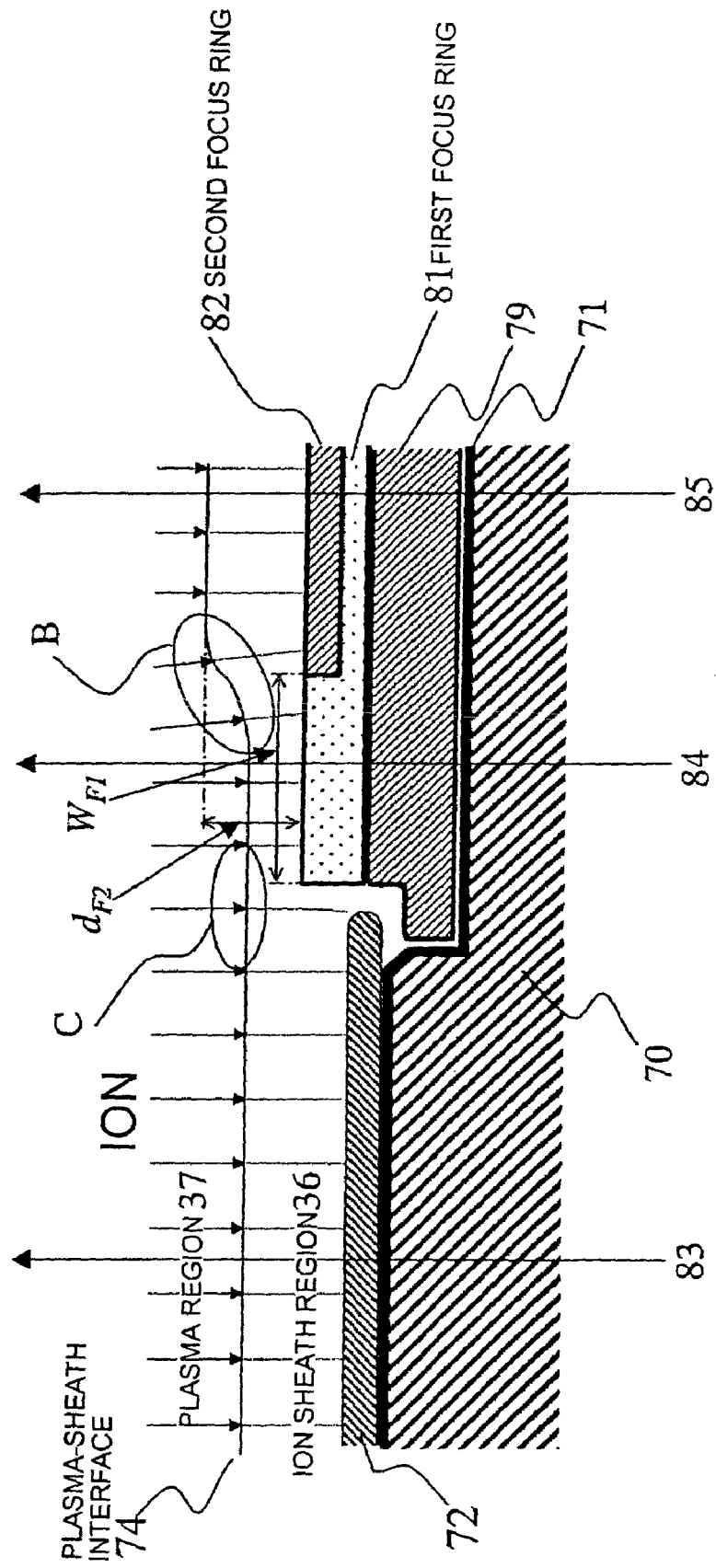
FIG. 20 is an enlarged cross-sectional view showing the area near a focus ring of a plasma processing apparatus corresponding to a tenth embodiment of the present invention.

FIG. 20 shows a tenth embodiment of the present invention. The characteristic feature of the present embodiment is that a first focus ring 81 formed of a dielectric material and a second focus ring 82 are equipped. The material of the second focus ring can be a conductor, a semiconductor or a dielectric. This structure is aimed at setting the surface voltage of the second focus ring 82 higher (or lower) than the surface voltage of the first focus ring 81. FIG. 20 shows the state in which the voltage is set higher. The designing of this structure is carried out via the following procedure. First, three routes for transmitting RF power are considered. The first route 83 passes through the wafer 72, which is the same as that described with reference to FIGS. 4 and 8. The second route 84 passes only the first focus ring 81, which is also the same as that described with reference to FIGS. 4 and 8, similar to the first route 83. The third route 85 passes through the second focus ring 82, which is a new route for power introduced for the first time by the present design.

Figure 21:
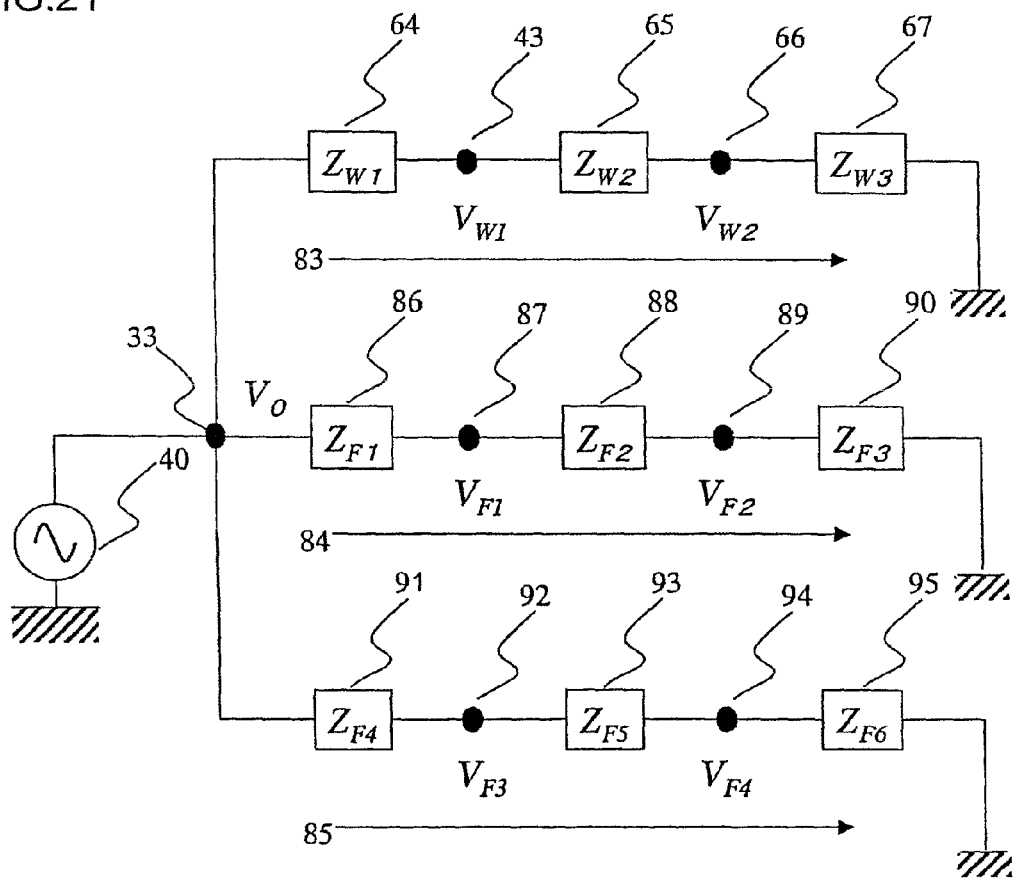
FIG. 21 is an equivalent circuit diagram corresponding to the tenth embodiment of the present invention.

The equivalent circuit corresponding to these three routes is illustrated in FIG. 21. The impedance of all the elements described here can be determined realistically through calculation or measurement, as have been mentioned heretofore, and can be subjected to numerical analysis. At this time, the plasma-sheath interface flattening can be realized if the plasma-sheath interface above the wafer 72 and that above the first focus ring 81 are flat, so formulas 7 and 8 can be applied directly. At this time, sheath height difference occurs to the plasma-sheath interface above the boundary between the first and second focus rings 81 and 82, as shown by B in FIG. 20. It is necessary that the electric field distortion caused by the sheath height difference B does not influence the electric field at the wafer 72 edge shown by C in FIG. 20. The condition for this is $W_{F1} > d_{F2}$, with the sheath thickness $d_{F2}$ above the second focus ring 82 thicker than the sheath thickness above the first focus ring 81. $W_{F1}$ is the width of the surface of the first focus ring 81, and the definition thereof is shown in FIG. 20. By keeping this condition, the surface potential of the second focus ring 82 and the height thereof (the surface heights of the first and second focus rings 81 and 82 are the same in FIG. 20) can be determined arbitrarily within the existing range of analyzed solution. Based on the above-mentioned equivalent circuit analysis and the plasma-sheath interface flattening condition, a focus ring can be designed that flattens the distortion of electric field near the wafer edge and enhances the uniformity of the process. Naturally, the height of the focus ring 81 can be redesigned corresponding to the process variation tolerance described in FIG. 10 in order to determine the final structure of the focus ring 81.

The present invention carries out the optimization process by optimizing the design of the focus ring surface potential to prevent wafer process reaction products from being deposited on the focus ring.

The present invention has been described with the plasma etching process of wafer taken as the main example. However, the present invention can be applied generally to any surface processing and processing apparatus using plasma. These apparatuses and processes include a plasma CVD apparatus and CVD process, a plasma ashing apparatus and ashing process, and plasma sputtering apparatus and sputtering process. The present invention can also be applied regardless of the plasma generating means being used. The possible plasma generating means include an inductive coupled plasma generating apparatus, a capacitive coupled plasma generating apparatus, an electron cyclotron resonance plasma generating apparatus, a helicon plasma generating apparatus, a surface wave plasma generating apparatus, and a magnetron plasma generating apparatus. Further, the substrate to be processed can include a semiconductor wafer, a dielectric wafer such as a quartz wafer, an LCD substrate and a conductive wafer such as AlTiC.

What is claimed is:

1. A plasma processing apparatus for plasma processing an object, the plasma processing apparatus comprising:
   a processing stage upon which the object to be processed is placed;
   a focus ring disposed on the processing stage and surrounding the object to be processed;
   an RF power supply for applying RF bias to the object to be processed and to the focus ring;
   means for performing an equivalent circuit analysis and acquiring both a voltage on a surface of the object to be processed and the focus ring, and a sheath height on the surface of the object to be processed and the focus ring;
   means for performing a two dimensional plasma analysis and a two dimensional electric field analysis, based on a result of the equivalent circuit analysis;
   means for optimizing a configuration of the focus ring based on results of the two dimensional plasma analysis and the two dimensional electric field analysis, and based on a plasma-sheath interface flattening condition for making a first voltage drop of an RF voltage from the processing stage to a plasma-sheath interface above the object to be processed equal to a second voltage drop of an RF voltage from the processing stage to a plasma-sheath interface above the focus ring; and
   means for making a sum of a surface height of the object to be processed and a sheath height of the surface of the object to be processed equal to a sum of a surface height of the focus ring and the sheath height of the surface of the focus ring,
   wherein the first voltage drop is calculated based on a voltage on a surface of the object to be processed, and
   wherein the second voltage drop is calculated based on a voltage on a surface of the focus ring.

* * * * *